United States Patent
Yamada

(10) Patent No.: US 11,644,925 B2
(45) Date of Patent: May 9, 2023

(54) INPUT APPARATUS, METHOD FOR CONTROLLING THE SAME, AND PROGRAM

(71) Applicant: Alps Alpine Co., Ltd., Tokyo (JP)

(72) Inventor: Tomoki Yamada, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 287 days.

(21) Appl. No.: 16/985,074

(22) Filed: Aug. 4, 2020

(65) Prior Publication Data
US 2020/0363901 A1   Nov. 19, 2020

Related U.S. Application Data

(63) Continuation of application No. PCT/JP2018/044052, filed on Nov. 29, 2018.

(30) Foreign Application Priority Data

Feb. 9, 2018 (JP) .............................. JP2018-022391

(51) Int. Cl.
| | | |
|---|---|---|
| G06F 3/041 | (2006.01) | |
| G06F 3/044 | (2006.01) | |
| H03K 17/955 | (2006.01) | |

(52) U.S. Cl.
CPC ............ G06F 3/0418 (2013.01); G06F 3/044 (2013.01); H03K 17/955 (2013.01); *G06F 2203/04108* (2013.01)

(58) Field of Classification Search
CPC .............. G06F 3/0418; G06F 3/044; G06F 2203/04108; H03K 17/955
See application file for complete search history.

(56) References Cited

U.S. PATENT DOCUMENTS

| | | | | |
|---|---|---|---|---|
| 10,045,111 | B1 * | 8/2018 | Bonner | H04R 1/1041 |
| 2005/0068712 | A1 * | 3/2005 | Schulz | H03K 17/955 |
| | | | | 361/287 |
| 2008/0047764 | A1 * | 2/2008 | Lee | G06F 3/0418 |
| | | | | 178/18.06 |
| 2008/0252474 | A1 * | 10/2008 | Nakamura | H03K 17/955 |
| | | | | 340/657 |

FOREIGN PATENT DOCUMENTS

| | | |
|---|---|---|
| JP | H01-863327 U | 6/1989 |
| JP | 5677828 | 1/2015 |

OTHER PUBLICATIONS

International Search Report dated Feb. 19, 2019 from International Application No. PCT/JP2018/044052.

* cited by examiner

*Primary Examiner* — Daniel R Miller
*Assistant Examiner* — Eric Sebastian Von Wald
(74) *Attorney, Agent, or Firm* — Beyer Law Group LLP

(57) ABSTRACT

An input apparatus includes a detection unit that repeatedly generates a detection signal according to a degree of proximity of the object, a drift simulation unit that generates a drift simulated signal that undergoes a change having correlation with a drift in the detection signal due to repeated generation of the detection signal in the detection unit, and a correction unit that corrects the detection signal according to the change in the drift simulated signal at least one of when repeated generation of the detection signal in the detection unit is started and when an interval for repeatedly generating the detection signal in the detection unit is changed.

19 Claims, 17 Drawing Sheets

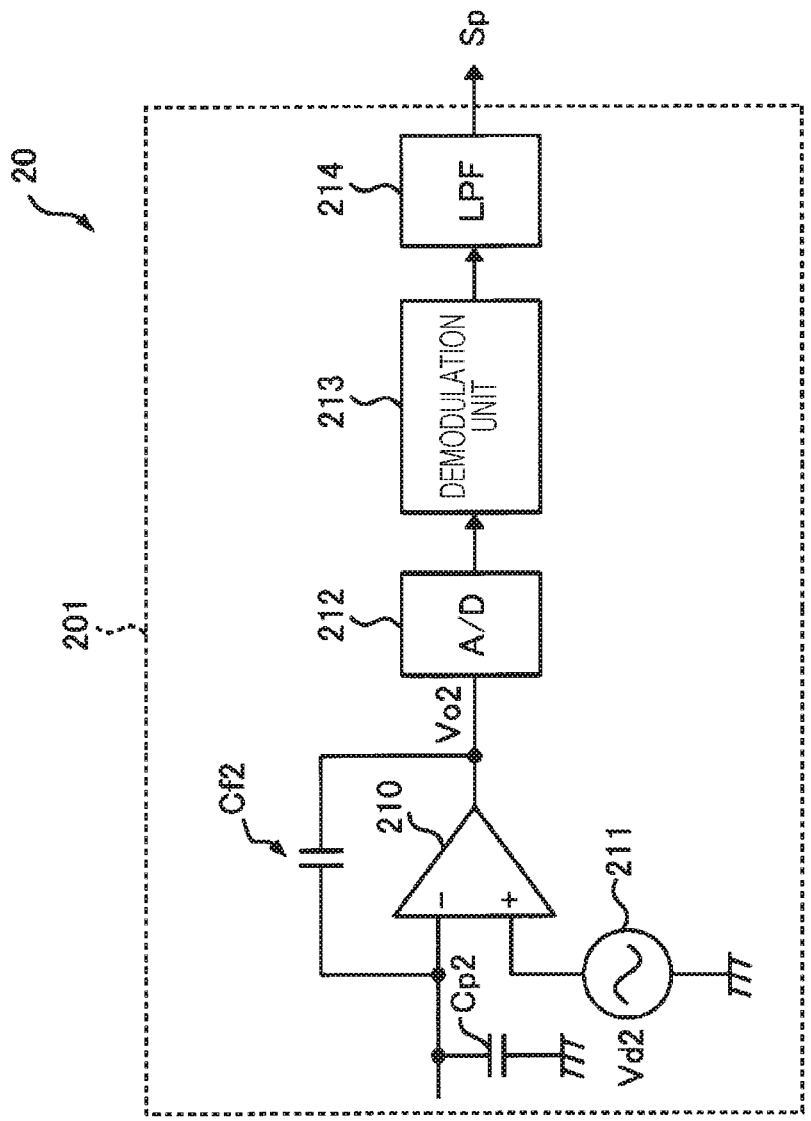

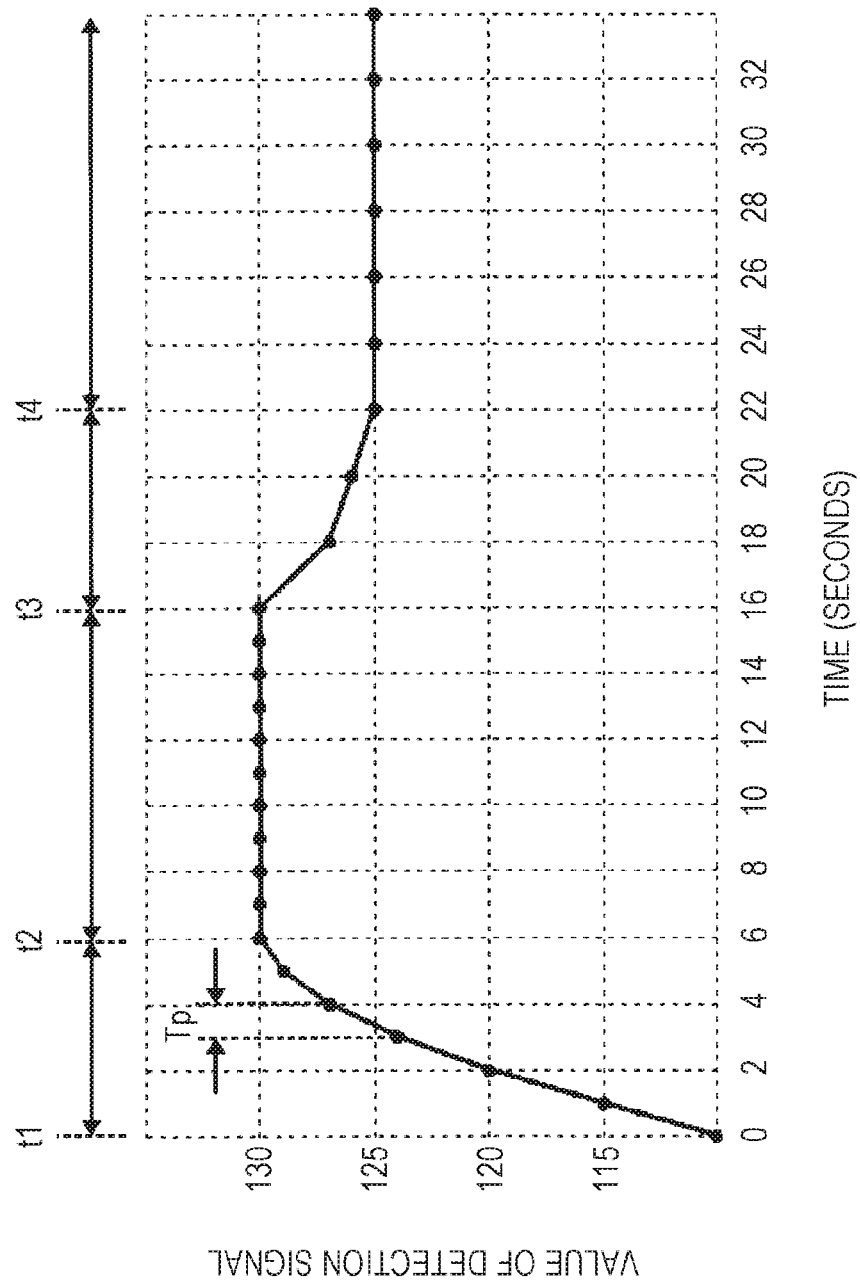

INPUT APPARATUS, METHOD FOR CONTROLLING THE SAME, AND PROGRAM

CLAIM OF PRIORITY

This application is a Continuation of International Application No. PCT/JP2018/044052 filed on Nov. 29, 2018, which claims benefit of Japanese Patent Application No. 2018-022391 filed on Feb. 9, 2018. The entire contents of each application noted above are hereby incorporated by reference.

BACKGROUND OF THE INVENTION

1. Field of the Invention

The present disclosure relates to input apparatuses for inputting information according to the proximity of an object, a method for controlling the same, and a program, for example, input apparatuses such as a touch sensor and a touch pad for use in inputting information in various apparatuses.

2. Description of the Related Art

Various apparatuses are known which detect that an object, such as a finger, has approached and which input the detection result as information. Examples of such input apparatuses include a touch sensor that detects whether, for example, a finger, has touched and a touch pad capable of obtaining information on the contact position. Japanese Patent No. 5677828 discloses a touch operation button that detects a touch operation on the basis of a change in capacitance.

When the degree of proximity of an object is detected on the basis of a change in capacitance or the like, the detection result may change due to factors other than the proximity of the object. The apparatus disclosed in Japanese Patent No. 5677828 uses values of temperature and humidity measured by a temperature and humidity measuring means to correct a change in the capacitance detection result due to the influence of temperature and humidity at the installation location of the apparatus.

However, factors responsible for the change in the result of detection of the degree of proximity of an object include not only external factors, such as temperature and humidity, but also internal factors due to repetition of the detecting operation. For example, with a general capacitance sensor, the capacitor charges and discharges every time a detecting operation is performed in a capacitance detection circuit. If the capacitor charges and discharges, a current flows through a resistor in the detection circuit as the electric charges move to generate heat in the detection circuit. Since the detection circuit includes various circuit elements (a resistor and a capacitor) having temperature characteristics, including a parasitic element, a change in temperature in the detection circuit causes a change (drift) in the detection result. Especially, immediately after power is turned on, the heat generation in the detection circuit is zero, which may cause a large drift in the detection result due to the repetition of the detecting operation.

The apparatus disclosed in Japanese Patent No. 5677828 measures the temperature and humidity at the apparatus installation location with a sensor (a temperature and humidity measuring means), and does not measure an increase in the temperature and so on in the circuit caused by the repetition of the detecting operation. For this reason, this has a disadvantage in that, even if the capacitance detection result is corrected on the basis of the measured value of the sensor, the drift in the detection result caused by the repetition of the detecting operation cannot be appropriately corrected. This also has a disadvantage in that, if a local change in temperature occurs at the location where the sensor is disposed, the apparatus may execute unnecessary correction, decreasing the accuracy of the detection result conversely.

SUMMARY OF THE INVENTION

The present invention provides an input apparatus capable of appropriately correcting a drift in the detection result caused by repetition of detection of the degree of proximity of the object, a method for controlling the same, and a program.

In an aspect of the present invention, an input apparatus for inputting information according to the proximity of an object includes a detection unit that repeatedly generates a detection signal according to the degree of proximity of the object, a drift simulation unit that generates a drift simulated signal that undergoes a change having correlation with a drift in the detection signal due to repeated generation of the detection signal in the detection unit, and a correction unit that corrects the detection signal according to the change in the drift simulated signal at least one of when repeated generation of the detection signal in the detection unit is started and when an interval for repeatedly generating the detection signal in the detection unit is changed.

BRIEF DESCRIPTION OF THE DRAWINGS

FIG. 2B is a diagram illustrating an example of the configuration of a drift simulation unit;

FIG. 3 is a diagram for illustrating the drift of the detection signal;

DESCRIPTION OF THE PREFERRED EMBODIMENTS

First Embodiment

An input apparatus according to a first embodiment will be described with reference to the drawings.

Figure 1:
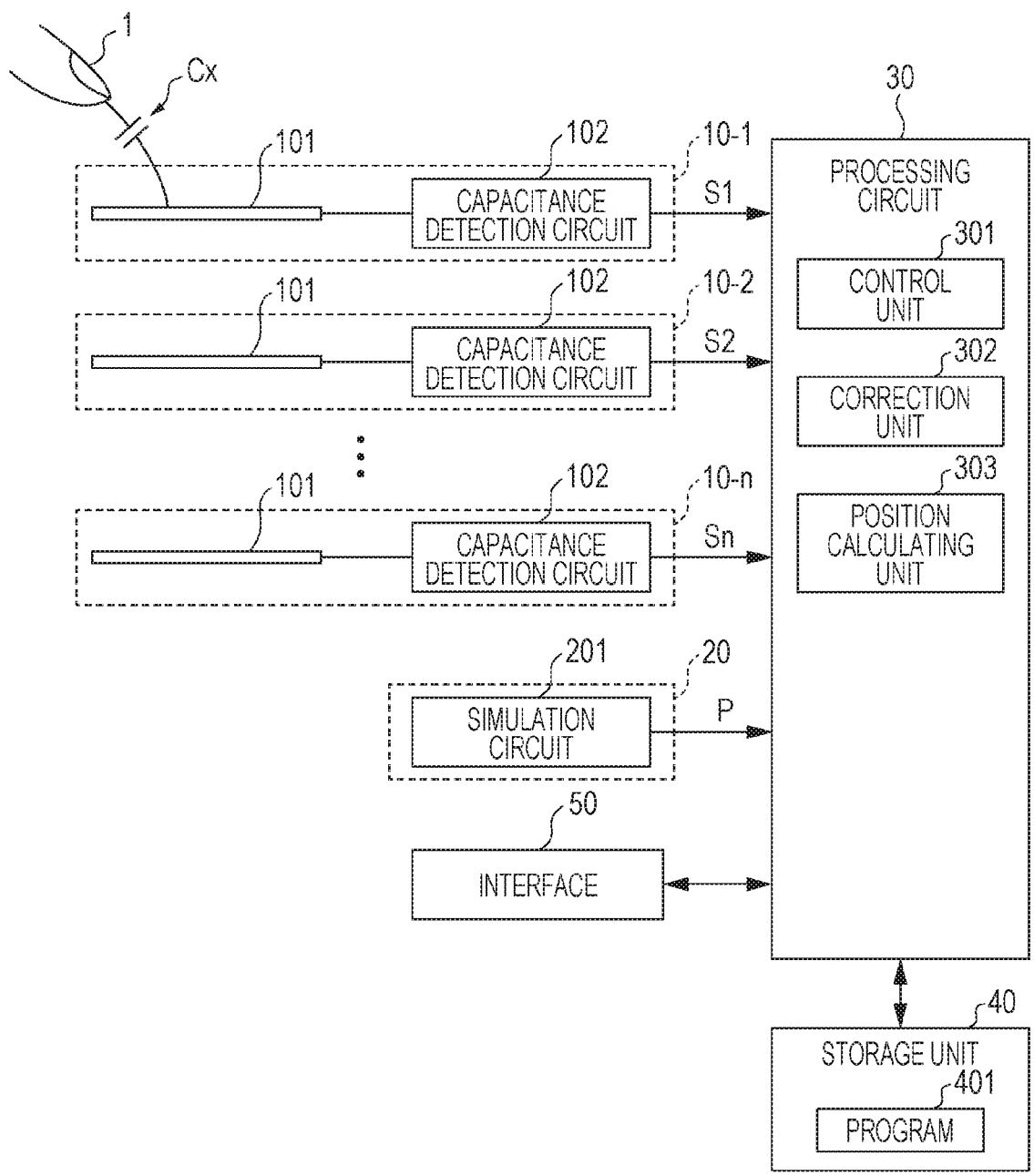
FIG. 1 is a diagram illustrating an example of the configuration of an input apparatus according to a first embodiment.
Figure 2A:
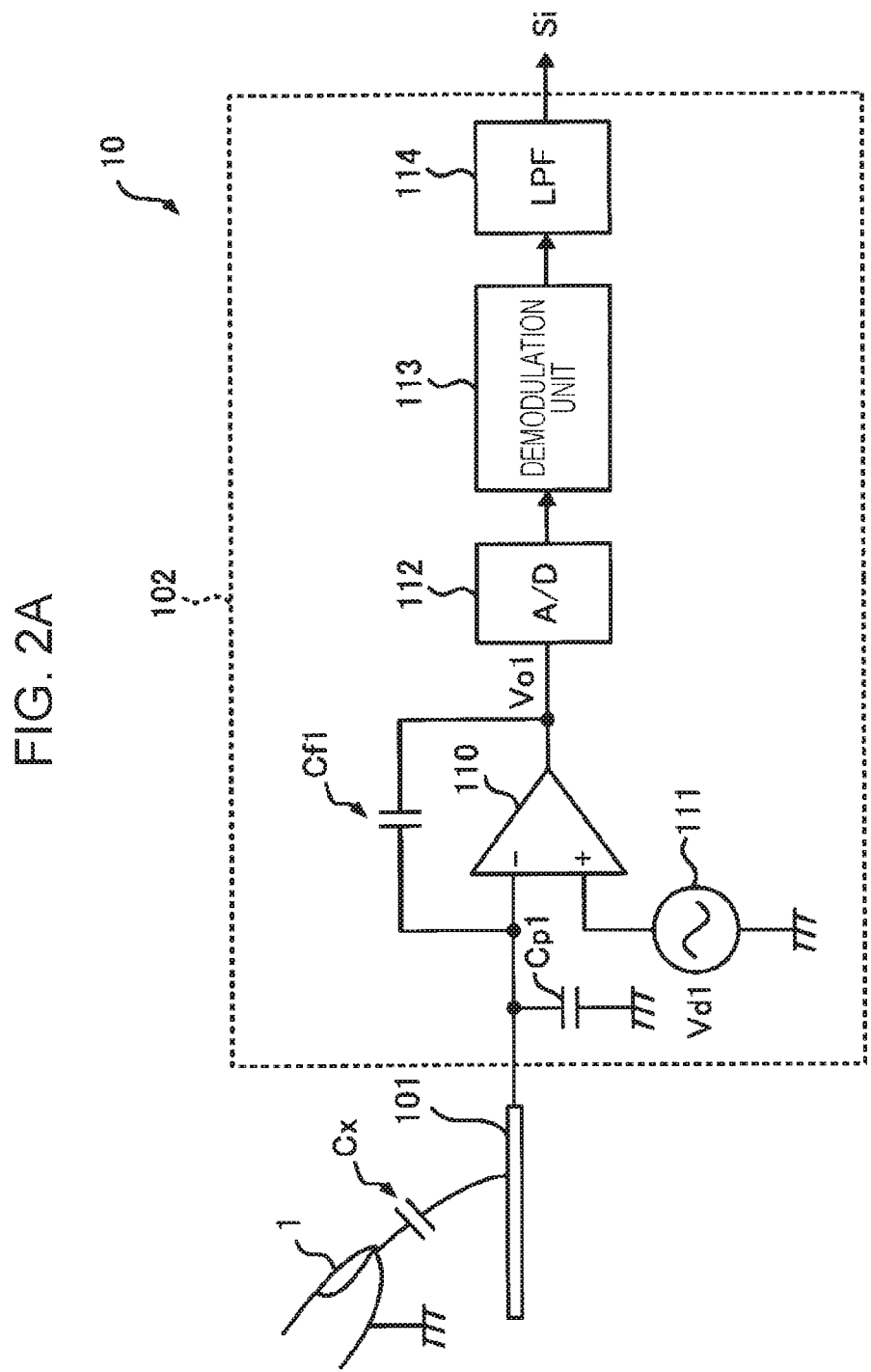
FIG. 2A is a diagram illustrating an example of the configuration of a detection unit.

FIG. 1 is a diagram illustrating an example of the configuration of the input apparatus according to the first embodiment. The input apparatus illustrated in FIG. 1 includes n detection units 10-1 to 10-n (hereinafter also referred to as "detection unit 10" without distinction), a drift simulation unit 20, a processing unit 30, a storage unit 40, and an interface 50. FIG. 2A is a diagram illustrating an example of the configuration of the detection unit 10, and FIG. 2B is a diagram illustrating an example of the configuration of the drift simulation unit 20.

The input apparatus according to the present embodiment is an apparatus for inputting information according to the degree of proximity of an object, such as a finger or a pen, and inputs information on whether an object has touched the operation surface, a contact position, the degree of proximity, and so on, like a touch sensor and a touch panel. The term "proximity" in this specification indicates that the object is present nearby and does not limit whether the object is in contact.

Detection Unit 10

The detection unit 10-i (i is an integer from 1 to n) generates a detection signal Si (hereinafter also referred to as "detection signal S" without distinction) according to the degree of proximity of an object 1 (for example, a finger). The detection unit 10 repeatedly generates a detection signal S according to the control of a control unit 301 of the processing unit 30, described later.

The detection unit 10 includes a detection electrode 101 and a capacitance detection circuit 102, as illustrated in FIG. 2A, for example. The detection electrode 101 forms a capacitor Cx whose capacitance changes according to the degree of proximity of the object 1. The capacitor Cx is a parasitic capacitance component formed between the object 1, such as a finger, which is regarded as an alternating-current conductor of a ground potential, and the detection electrode 101. The capacitance of the capacitor Cx increases as the object 1 comes closer to the detection electrode 101.

The capacitance detection circuit 102 generates a detection signal S according to the electric charge of the capacitor Cx transmitted via the detection electrode 101. As illustrated in FIG. 2A, the capacitance detection circuit 102 includes an operating amplifier 110, a driving-voltage supply unit 111, a capacitor Cf1, and an analog-to-digital converter (hereinafter referred to as "AD converter" or "A/D") 112, a demodulation unit 113, and a low-pass filter (LPF) 114.

The capacitor Cf1 is connected between an inverting input terminal and an output terminal of the operating amplifier 110. A non-inverting input terminal of the operating amplifier 110 is supplied with an alternating-current driving voltage Vd1 by the driving-voltage supply unit 111. The detection electrode 101 is connected to the inverting input terminal of the operating amplifier 110. The driving voltage Vd1 of the driving-voltage supply unit 111 is, for example, a sign wave AC voltage. Since the operating amplifier 110 controls an output voltage Vo1 so that the voltage of the inverting input terminal and the voltage of the non-inverting input terminal become substantially the same, substantially the same AC voltage as the driving voltage Vd1 is generated in the capacitor Cx. When AC voltage is generated in the capacitor Cx, a change in electric charge proportional to the AC voltage and the capacitance of the capacitor Cx occurs. The change in the electric charge of the capacitor Cx is substantially the same as a change in the electric charge of the capacitor Cf1. As a result, the AC voltage generated in the capacitor Cf1 has an amplitude substantially proportional to the capacitance of the capacitor Cx. The output voltage Vo1 of the operating amplifier 110 corresponds to the sum of the AC voltage generated in the capacitor Cf1 and the driving voltage Vd1.

The AD converter 112 converts the output voltage Vo1 of the operating amplifier 110 to a digital value. For example, the AD converter 112 includes a differential amplifier that amplifies the difference between the driving voltage Vd1 of the driving-voltage supply unit 111 and the output voltage Vo1 of the operating amplifier 110 to attenuate a harmonic component that causes aliasing and outputs it. The AD converter 112 converts an output signal from the differential amplifier (a signal corresponding to the AC voltage of the capacitor Cf1) to a digital value.

The demodulation unit 113 demodulates a component corresponding to the amplitude of the AC voltage of the capacitor Cf1, that is, a component proportional to the capacitance of the capacitor Cx, from the signal converted to the digital value by the AD converter 112. For example, the demodulation unit 113 multiplies the signal converted to the digital value by the AD converter 112 by an alternating current signal substantially in phase with the driving voltage Vd1. The low-pass filter 114 removes a harmonic component obtained by the multiplying operation of the demodulation unit 113. This makes the detection signal S output from the low-pass filter 114 substantially proportional to the capacitance of the capacitor Cx.

FIG. 3 is a diagram for illustrating the drift of the detection signal S. In the graph of FIG. 3, the vertical axis indicates the value of the detection signal S in a state in which the object 1 is not in proximity to the detection electrode 101, and the horizontal axis indicates the time (in seconds) elapsed from the time the detection is started (for example, at power up). In the example of FIG. 3, the detection signal S exhibits a relatively large change from detection start time t1 to time t2 when six seconds has passed. One of factors that cause such a change in the detection signal S is heat generated in the capacitance detection circuit 102 caused by the repeated generation of the detection signal S.

When the capacitance of the capacitor Cx is detected in the capacitance detection circuit 102 illustrated in FIG. 2A, electric charges move between the capacitor Cx and the capacitor Cf1 via the detection electrode 101, and a consumption current flows through a resistor in the operating amplifier 110 because of an amplifying operation caused by the movement of the electric charges, so that the resistor generates heat. When the temperature of circuit element (a resistor, a capacitor, and so on) constituting the capacitance detection circuit 102 is increased due to the heat generated in the resistor, the element values (a resistor value, a capacitance value, and so on) change according to the temperature characteristics of the circuit elements, which causes a change in the detection signal S. Furthermore, parasitic capacitance Cp1, as illustrated in FIG. 2A, is present, for example, at an input of the operating amplifier 110 of the capacitance detection circuit 102. Since the parasitic capacitance Cp1 is connected in parallel to the capacitor Cx, the value of the capacitance represented by the detection signal S increases by an amount corresponding to the parasitic capacitance Cp1. When the capacitance of the parasitic capacitance Cp1 changes because of the heat generated in the circuit, described above (in general, the capacitance increases with an increasing temperature), a drift occurs in the detection signal S with the change.

In the example of FIG. 3, the value of the detection signal S is kept constant after time t2. This is because the heat generation and the heat radiation in the circuit become balanced, so that the change in the temperature of the circuit elements is decreased, and therefore the change in the element values of the circuit element with the change in the temperature is decreased.

Furthermore, in the example of FIG. 3, the interval Tp of the repeated generation of the detection signal S increases from one second to two seconds at time t3. When the interval Tp of generation of the detection signal S increases, the heat generated in the resistor in the capacitance detection circuit 102 decreases to get out of the balance with the radiated heat to decrease the temperature of the circuit elements constituting the capacitance detection circuit 102. The decrease in the temperature of the circuit elements changes the element values because of the temperature characteristics of the circuit elements, causing a change in the detection signal S. In the example of FIG. 3, the element value of the detection signal S decreases from time t3 to time t4. After time t4, the heat generation and the heat radiation in the circuit becomes balanced again to decrease the change in the element values of the circuit elements due to the change in temperature, and the detection signal S converges to a fixed value.

Drift Simulation Unit 20

The drift simulation unit 20 generates a drift simulated signal P that changes in correlation with the drift of the detection signal S due to the repeated generation of the detection signal S in the detection unit 10. The drift simulation unit 20 repeatedly generates the drift simulated signal P according to the control of the control unit 301 of the processing unit 30 described later.

The drift simulation unit 20 includes a simulation circuit 201 in the example of FIG. 1. The simulation circuit 201 is, if connected to the detection electrode 101, capable of generating a signal similar to the detection signal S according to the electric charge of the capacitor Cx transmitted via the detection electrode 101 and, if not connected to the detection electrode 101, generates the drift simulated signal P. The simulation circuit 201 repeatedly generates the drift simulated signal P at the same intervals as the interval for repeatedly generating the detection signal S, as in the simulation circuit 201 and the capacitance detection circuit 102.

As illustrated in FIG. 2B, for example, the simulation circuit 201 has substantially the same configuration as that of the capacitance detection circuit 102 illustrated in FIG. 2A. In other words, an operating amplifier 210, a driving-voltage supply unit 211, a capacitor Cf2, an AD converter 212, a demodulation unit 213, and a low-pass filter 214 included in the simulation circuit 201 illustrated in FIG. 2B respectively correspond to the operating amplifier 110, the driving-voltage supply unit 111, the capacitor Cf1, the AD converter 112, the demodulation unit 113, and the low-pass filter 114 included in the capacitance detection circuit 102 illustrated in FIG. 2A.

Since the simulation circuit 201 is not connected to the detection electrode 101, a change in the drift simulated signal P due to the proximity of the object 1 to the detection electrode 101 does not occur. However, since the simulation circuit 201 has a similar configuration to that of the capacitance detection circuit 102, a change in the drift simulated signal P due to another factor independent of the detection electrode 101 is likely to exhibit similar tendency to that of the detection signal S. Accordingly, when the simulation circuit 201 generates the drift simulated signal P at the same intervals as those of the interval for repeatedly generating the detection signal S in the capacitance detection circuit 102, the drift simulated signal P undergoes a change with a similar tendency as that of the drift of the detection signal S.

Processing Unit 30

The processing unit 30 is a circuit that controls the overall operation of the input apparatus and includes, for example, a computer that performs processing according to the command codes of a program 401 stored in the storage unit 40 and dedicated hardware (a logic circuit and so on) configured to implement specific functions. All of the processing of the processing unit 30 may be implemented by the computer on the basis of the program 401 or at least part thereof may be implemented by dedicated hardware.

In the example of FIG. 1, the processing unit 30 includes the control unit 301, a correction unit 302, and a position calculating unit 303.

The control unit 301 controls generation of the detection signals S1 to Sn by the detection units 10-1 to 10-$n$ and generation of the drift simulated signal P by the drift simulation unit 20. For example, the control unit 301 controls the detection units 10-1 to 10-$n$ and the drift simulation unit 20 so that the detection signals S1 to Sn and the drift simulated signal P are repeatedly generated at the same intervals. The control unit 301 also controls the drift simulation unit 20 so that the generation of the drift simulated signal P is stopped when update of the correction values of the detection signals S1 to Sn is stopped in the correction unit 302, described later. Furthermore, the control unit 301 performs control for changing the interval for repeatedly generating the detection signals S1 to Sn according to, for example, a command from an external control unit input in the interface 50, described later, for stopping the generation of the detection signals S1 to Sn, or for starting the generation of the detection signals S1 to Sn again.

The correction unit 302 performs processing for correcting the detection signal S according to a change in the drift simulated signal P. For example, when repeated generation of the detection signals S1 to Sn in the detection units 10-1 to 10-$n$ is started, or when the interval for repeatedly generating the detection signals S1 to Sn in the detection units 10-1 to 10-$n$ is changed, the correction unit 302 corrects the detection signals S1 to Sn according to a change in the drift simulated signal P. The correction unit 302 updates correction values indicating the degrees of correction of the detection signals S1 to Sn according to a change in the drift simulated signal P.

When predetermined time T1 has passed from the start of the repeated generation of the detection signals S1 to Sn in the detection units 10-1 to 10-n, or when predetermined time T2 has passed from the update of the interval for repeatedly generating the detection signals S1 to Sn in the detection units 10-1 to 10-n, the correction unit 302 stops the update of the correction values of the detection signals S1 to Sn according to a change in the drift simulated signal P.

The correction unit 302 calculates the value of change, ΔP, indicating an increase or decrease in the drift simulated signal P, for example, on the basis of a series of drift simulated signals P generated in the drift simulation unit 20 and subtracts a correction value Sc corresponding to the value of change ΔP from each of the detection signals S1 to Sn.

An example of the value of change ΔP is a value obtained by subtracting an initial value, which is the drift simulated signal P generated at the start of the correction, from the drift simulated signal P generated thereafter. In another example, the value of change ΔP may be a value obtained by adding up the difference between continuously generated two drift simulated signals P in sequence.

An example of the correction value Sc is a value "α×ΔP" obtained by multiplying the value of change ΔP by a predetermined factor α. In another example, the correction value Sc may be a predetermined function "f(ΔP)" in which the value of change ΔP is a variable.

The position calculating unit 303 calculates a position to which the object 1, such as a finger, has come close on the basis of the detection signals S1 to Sn corrected by the correction unit 302. For example, the respective detection electrodes 101 of the detection units 10-1 to 10-n are arranged in two directions (the X-direction and the Y-direction) in the operation surface to which the object 1 comes close. The position calculating unit 303 calculates the position of the operating surface to which the object 1 has come close (the coordinate in the Y-direction and the coordinate in the X-direction) on the basis of the distribution of a group of detection signals S corresponding to the detection electrodes 101 arranged in the Y-direction and the distribution of a group of detection signals S corresponding to the detection electrodes 101 arranged in the Y-direction.

Storage Unit 40

The storage unit 40 stores constant data used by the processing unit 30 for processing and variable data that is temporarily referred to in the course of processing. The storage unit 40 also stores the program 401 that is executed by the computer of the processing unit 30. The storage unit 40 includes at least one of volatile memories, such as a dynamic random access memory (DRAM) and a static random access memory (SRAM), a non-volatile memory, such as a flash memory, and a magnetic storage unit, such as a hard disk.

Interface 50

The interface 50 is a circuit for exchanging data between the input apparatus and another control unit (for example, an integrated circuit (IC) for controlling an information instrument equipped with the input apparatus). The processing unit 30 outputs information stored in the storage unit 40 (for example, information on the coordinates of object 1) to the control unit (not illustrated) from the interface 50. The interface 50 may obtain the program 401 to be executed by the computer of the processing unit 30 from a non-transitory storage medium, such as an optical disk or a universal serial bus (USB) memory, or a server on the network and load the program 401 into the storage unit 40.

Operation

The operation of the input apparatus having the above configuration will be described hereinbelow with reference to the flowcharts of FIGS. 4 to 6.

Figure 4:
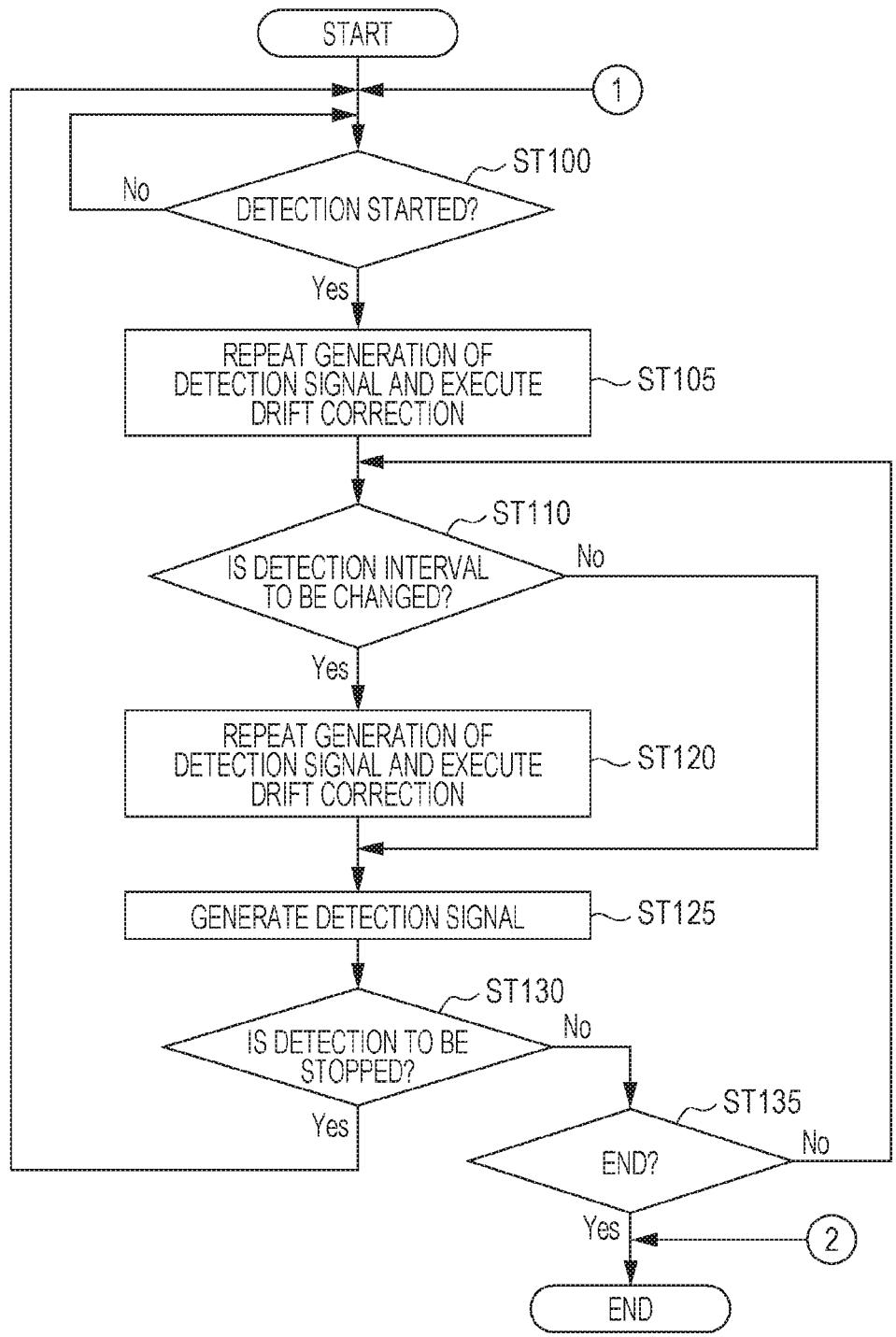
FIG. 4 is a flowchart for illustrating an example of processing for repeatedly generating a detection signal in the input apparatus illustrated in FIG. 1.

FIG. 4 is a flowchart for illustrating an example of processing for repeatedly generating the detection signal S in the input apparatus illustrated in FIG. 1. On startup at power-on or when a command to start a detecting operation is input to the interface 50 (ST100: Yes), the control unit 301 causes the detection unit 10 to repeatedly generate the detection signal S and the drift simulation unit 20 to repeatedly generate the drift simulated signal P at the same intervals as those of the detection signal S (ST105). At that time, the correction unit 302 performs processing for correcting the detection signal S according to a change in the drift simulated signal P (hereinafter also referred to as "drift correction"). The details of the operation of step ST105 will be described later.

When the update of the correction value by the drift correction in step ST105 is stopped and thereafter a command to change the interval for repeatedly generating the detection signal S is input to the interface 50 (ST110: Yes), the control unit 301 changes the interval for generating the detection signal S by the detection unit 10 and causes the drift simulation unit 20 to generate the drift simulated signal P repeatedly at the same intervals as those of the detection signal S (ST120). Also in this case, the correction unit 302 performs drift correction of the detection signal S according to a change in the drift simulated signal P. The details of the operation of step ST120 will be described later.

When a command to temporarily stop the generation of the detection signal S is input to the interface 50 (ST130: Yes), the control unit 301 returns to step ST100 and stops the generation of the detection signal S in the detection unit 10 until a command to start the generation of the detection signal S again is input to the interface 50. If the generation of the detection signal S is not stopped or ended and the power is not shut off (No in ST130 and ST135), the control unit 301 repeats the generation of the detection signal S by the detection unit 10 (ST125) at regular intervals.

Figure 5:
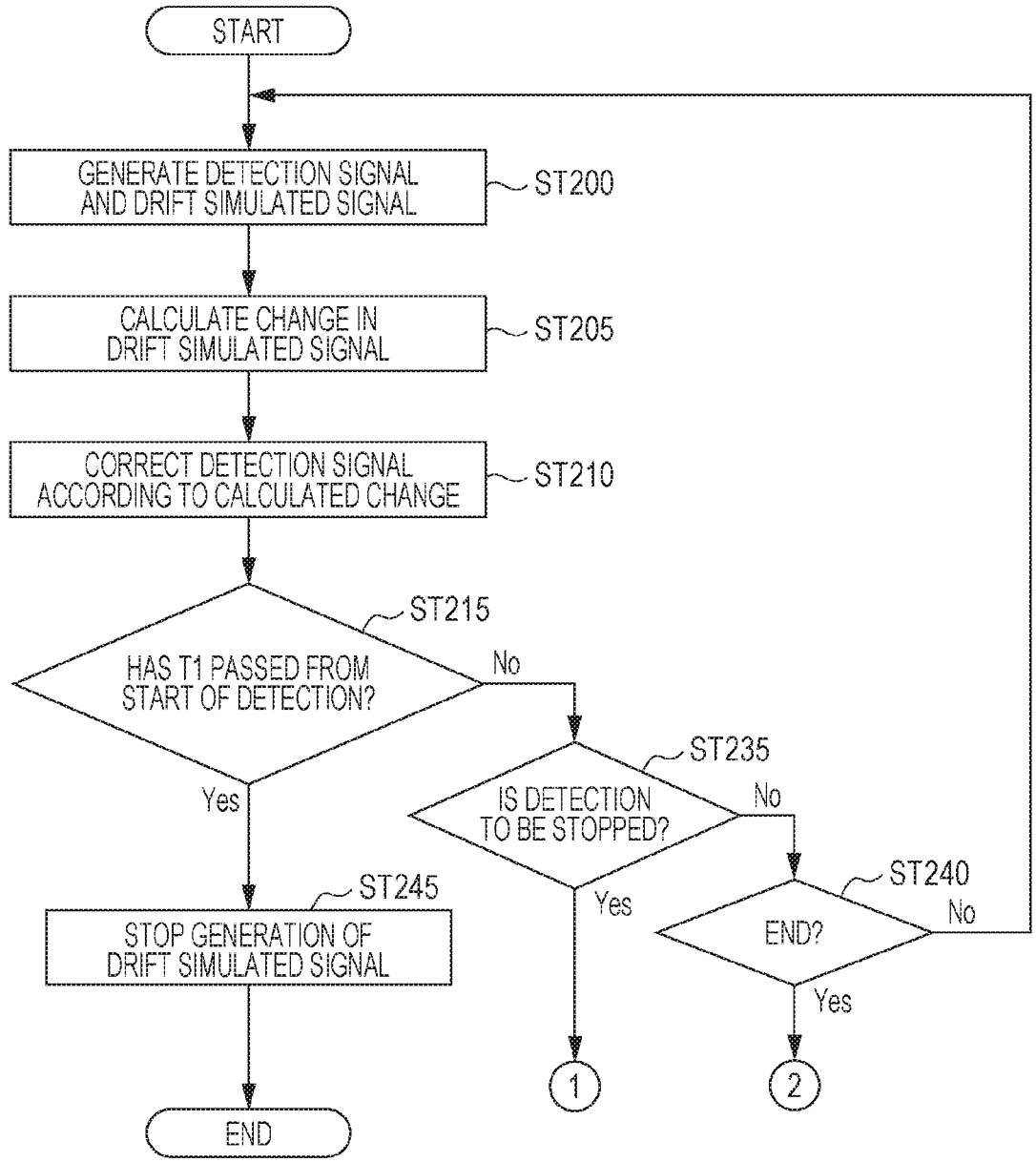
FIG. 5 is a flowchart for illustrating an example of the operation of drift correction after detection is started in the input apparatus illustrated in FIG. 1.

FIG. 5 is a flowchart for illustrating an example of the operation of drift correction after detection is started in the input apparatus illustrated in FIG. 1 (ST105 in FIG. 4). When the detection signal S is generated in the detection unit 10 and the drift simulated signal P is generated in the drift simulation unit 20 (ST200), the correction unit 302 calculates the value of change ΔP of the drift simulated signal P (ST205). For example, the correction unit 302 calculates the value of change ΔP by storing the drift simulated signal P at the start of the processing of step ST105 in the storage unit 40 as an initial value and subtracting the initial value from the drift simulated signal P that is newly obtained in step ST200.

The correction unit 302 corrects the detection signal S obtained in step ST200 according to the value of change ΔP calculated in step ST205 (ST210). For example, the correction unit 302 calculates a correction value Sc(=α×ΔP) obtained by multiplying the value of change ΔP by a predetermined factor α and subtracts the correction value Sc from the detection signal S obtained in step ST200 to obtain the corrected detection signal S.

Thereafter, the correction unit 302 determines whether predetermined time T1 has passed from the start of generation of the detection signal S in step ST100 (FIG. 4) (ST215), and if time T1 has not passed, the processing returns to step ST200, and the above processing is repeated. If time T1 has passed after the interval for generating the detection signal S is changed (ST215: Yes), the control unit 301 stops the generation of the drift simulated signal P in the drift simulation unit 20 (ST245). For example, the control unit 301 stops an analog-to-digital conversion operation of the AD converter 212, demodulation processing of the demodulation unit 213, and filtering processing of the low-pass filter 214.

When the generation of the drift simulated signal P is stopped, the correction unit 302 stops the update of the correction value Sc for the detection signal S according to a change in the drift simulated signal P but holds the correction value Sc calculated last in step ST210 in the storage unit 40. If the detection signal S is generated in step ST125 (FIG. 4), the correction unit 302 subtracts the fixed correction value Sc held in the storage unit 40 from the detection signal S.

When a command to temporarily stop the generation of the detection signal S is input to the interface 50 during the processing of step ST105 (ST235: Yes), the control unit 301 returns to step ST100 described above. If a command to end the generation of the detection signal S is input to the interface 50 (ST240: Yes), the processing unit 30 ends the processing for the generation of the detection signal S.

Figure 6:
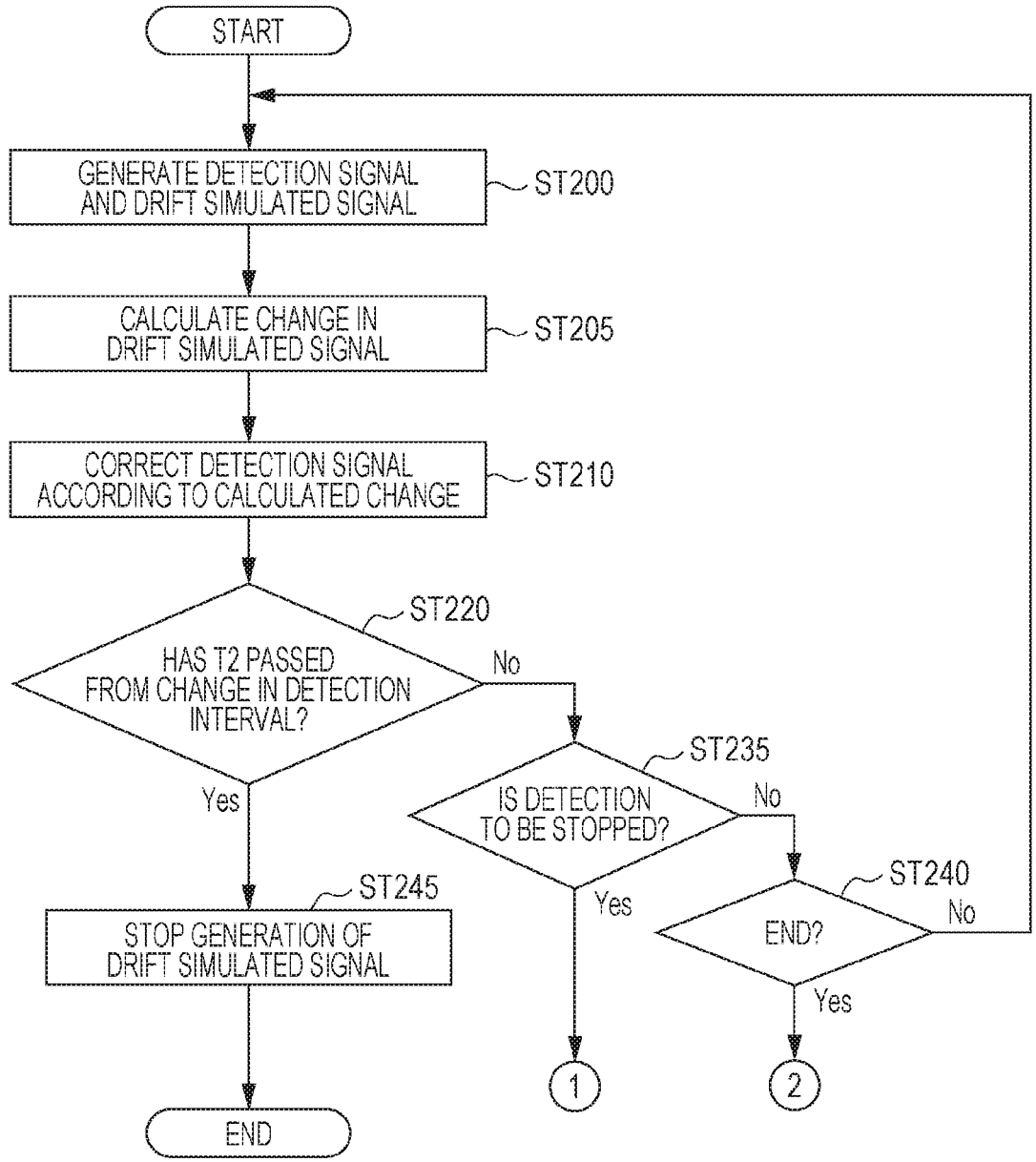
FIG. 6 is a flowchart for illustrating an example of the operation of drift correction after the detection interval has been changed in the input apparatus illustrated in FIG. 1.

FIG. 6 is a flowchart for illustrating an example of the operation for drift correction (ST120 in FIG. 4) after the detection interval has been changed in the input apparatus illustrated in FIG. 1. The flowchart illustrated in FIG. 6 is a flowchart in which step ST215 in the flowchart of FIG. 5 is replaced with step ST220 and the other steps are the same as those of the flowchart illustrated in FIG. 5. The correction unit 302 determined whether predetermined time T2 has passed after the interval for generating the detection signal S is changed in step ST110 (FIG. 4) (ST220), and if time T2 has not passed, the processing is returned to step ST200, and the processing after step ST200 is repeated. If time T2 has passed after the interval for generating the detection signal S is changed (ST220: Yes), the control unit 301 stops the generation of the drift simulated signal P in the drift simulation unit 20 (ST245). In this case, the correction unit 302 stops the update of the correction value Sc for the detection signal S according to a change in the drift simulated signal P.

With the input apparatus according to the present embodiment, a drift occurs in the detection signal S because of the repeated generation of the detection signal S by the detection unit 10, as described above. The drift simulation unit 20 generates the drift simulated signal P in which a change correlated to the drift occurs. When repeated generation of the detection signal S in the detection unit 10 is started and when the interval for repeatedly generating the detection signal S in the detection unit 10 is changed, the drift occurs in the detection signal S. In these cases, the detection signal S is corrected according to the change in the drift simulated signal P. Thus, the drift in the detection signal S due to the repeated generation of the detection signal S can be appropriately corrected.

With the input apparatus according to the present embodiment, when predetermined time T1 has passed after the repeated generation of the detection signal S in the detection unit 10 is started and when predetermined time T2 has passed after the interval for repeatedly generating the detection signal S in the detection unit 10 is changed, the update of the correction value of the detection signal S according to a change in the drift simulated signal P is stopped, and the generation of the drift simulated signal P is also stopped. This allows the power consumed to generate the drift simulated signal P to be reduced.

Modification Examples

Next, modification examples of the input apparatus according to the first embodiment will be described with reference to the flowcharts of FIGS. 7 to 9.

Figure 7:
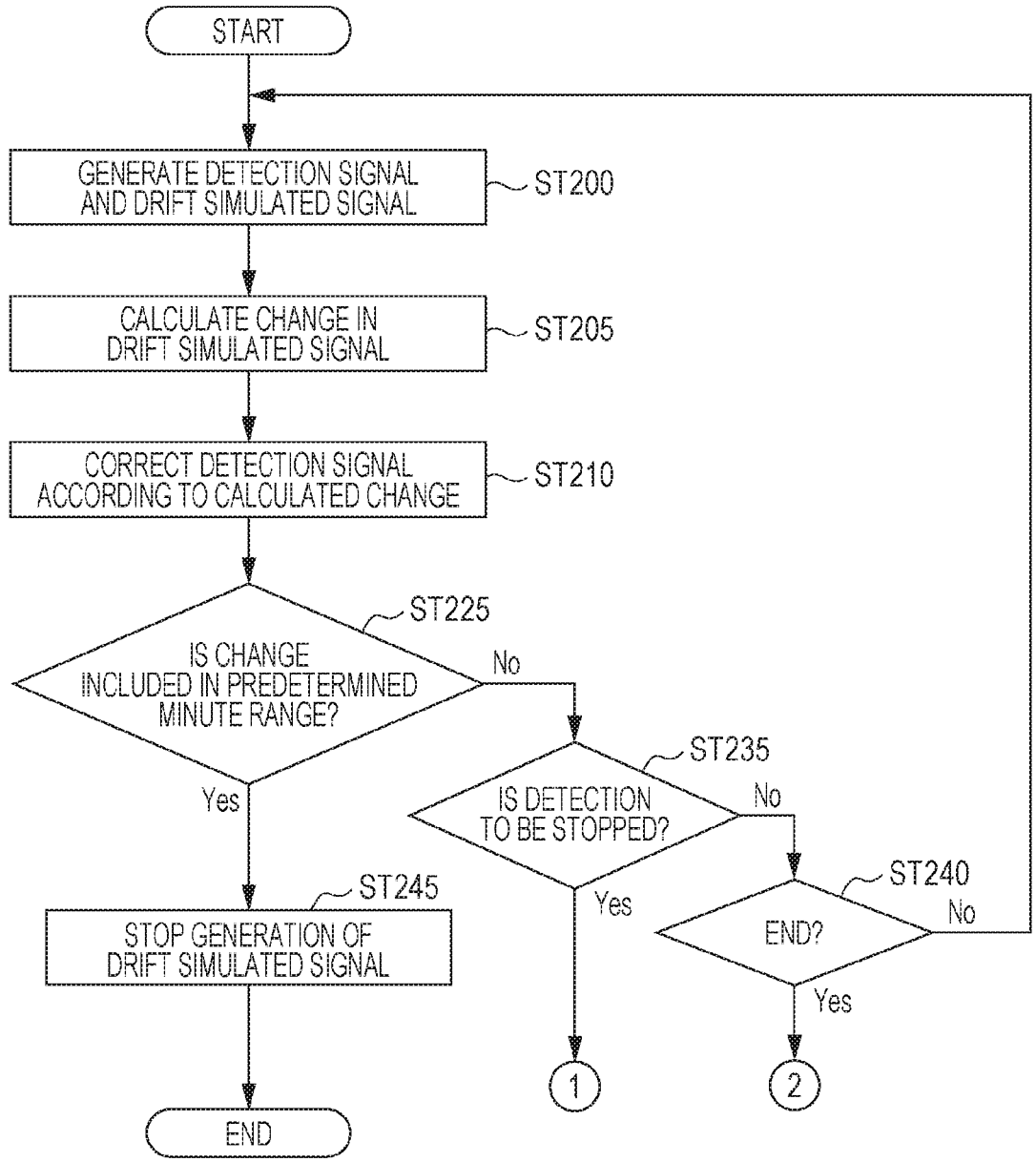
FIG. 7 is a flowchart for illustrating a modification example of the drift correction operation of the input apparatus illustrated in FIG. 1.

FIG. 7 is a flowchart for illustrating a modification example of the drift correction operations of the input apparatus illustrated in FIG. 1 (FIGS. 5 and 6). The flowchart illustrated in FIG. 7 is a flowchart in which step ST215 in the flowchart of FIG. 5 is replaced with step ST225 and the other steps are the same as those of the flowchart illustrated in FIG. 5. In the drift correction operations in the flowcharts of FIGS. 5 and 6, the update of the correction value by the drift correction is stopped when a predetermined time has passed from the detection start time or the detection-interval change time. However, in the drift correction operation of the flowchart of FIG. 7, the update of the correction value by drift correction is stopped when a change in the drift simulated signal P has decreased. In other words, the correction unit 302 determines whether the value of change ΔP calculated in step ST205 is included in a predetermined minute range (ST225), and if the value of change ΔP is not included in the predetermined minute range, the processing is returned to step ST200, and the processing after step ST200 is repeated. If the value of change ΔP is included in the predetermined minute range (step ST225: Yes), the control unit 301 stops the generation of the drift simulated signal P in the drift simulation unit 20 (ST245). Thus, also the method of determining whether the value of change ΔP is included in a predetermined minute range allows appropriate determination of whether a drift in the detection signal S caused by the repeated generation of the detection signal S has concluded.

Figure 8:
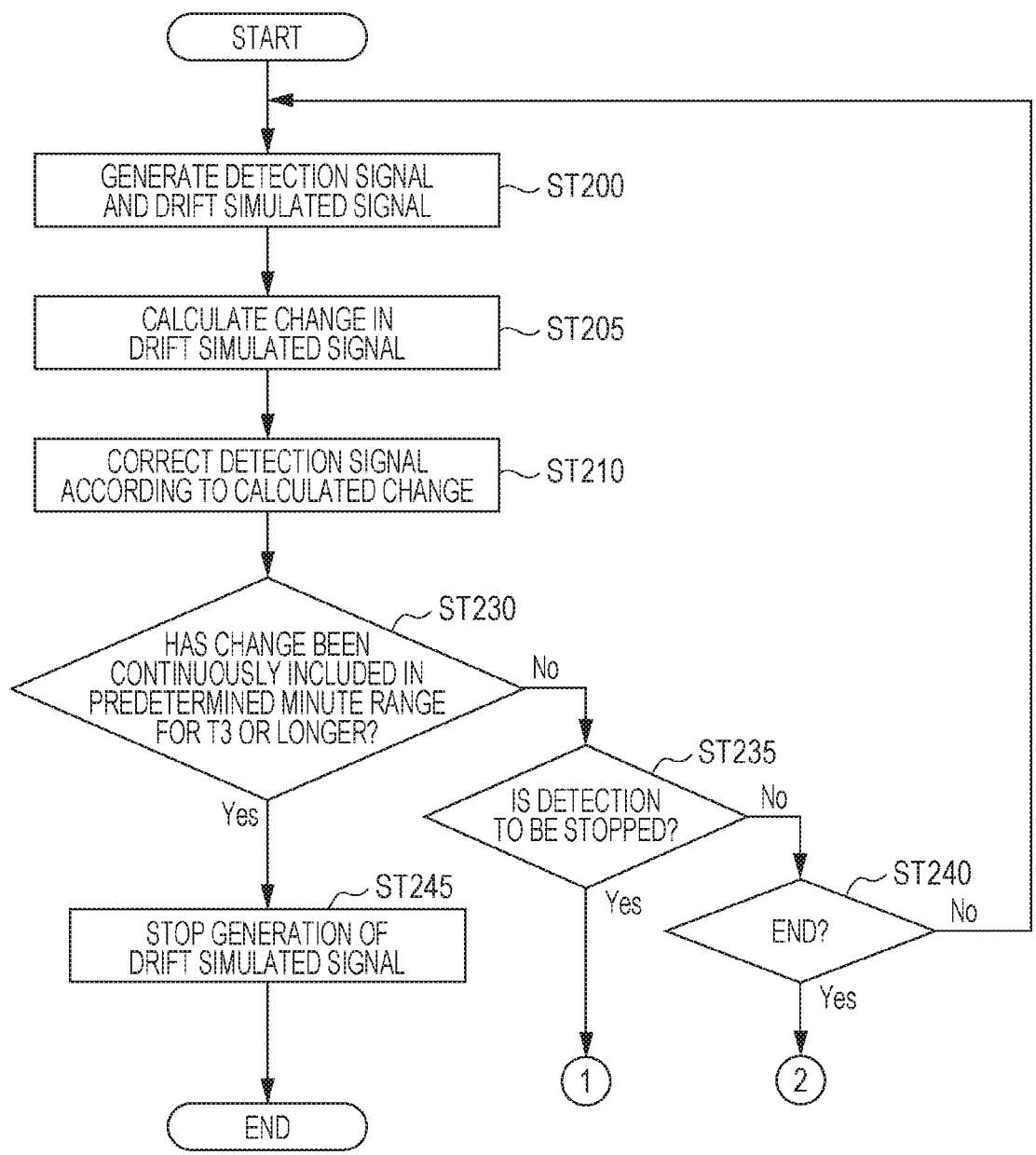
FIG. 8 is a flowchart for illustrating another modification example of the drift correction operation in the input apparatus illustrated in FIG. 1.

FIG. 8 is a flowchart for illustrating another modification example of the drift correction operations (FIGS. 5 and 6) in the input apparatus illustrated in FIG. 1. The flowchart illustrated in FIG. 8 is a flowchart in which step ST215 in the flowchart of FIG. 5 is replaced with step ST230 and the other steps are the same as those of the flowchart illustrated in FIG. 5 In the drift correction operation according to the flowchart of FIG. 8, the update of the correction value by the drift correction is stopped when a state in which a change in the drift simulated signal P has decreased continues for a predetermined time or more. In other words, the correction unit 302 determines whether a state in which the value of change ΔP calculated in step ST205 is included in the predetermined minute range continues for predetermined time T3 or longer (ST230), and if this state has not continued for time T3 or more, the processing returns to step ST200, and the processing after step ST200 is repeated. If the state in which the value of change ΔP is included in the predetermined minute range continues for time T3 or longer (step ST230: Yes), the control unit 301 stops the generation of the drift simulated signal P by the drift simulation unit 20 (ST245). Thus, also the method of determining the duration of the state in which the value of change ΔP is included in the predetermined minute range allows appropriate determination of whether a drift in the detection signal S caused by the repeated generation of the detection signal S has been concluded.

Figure 9:
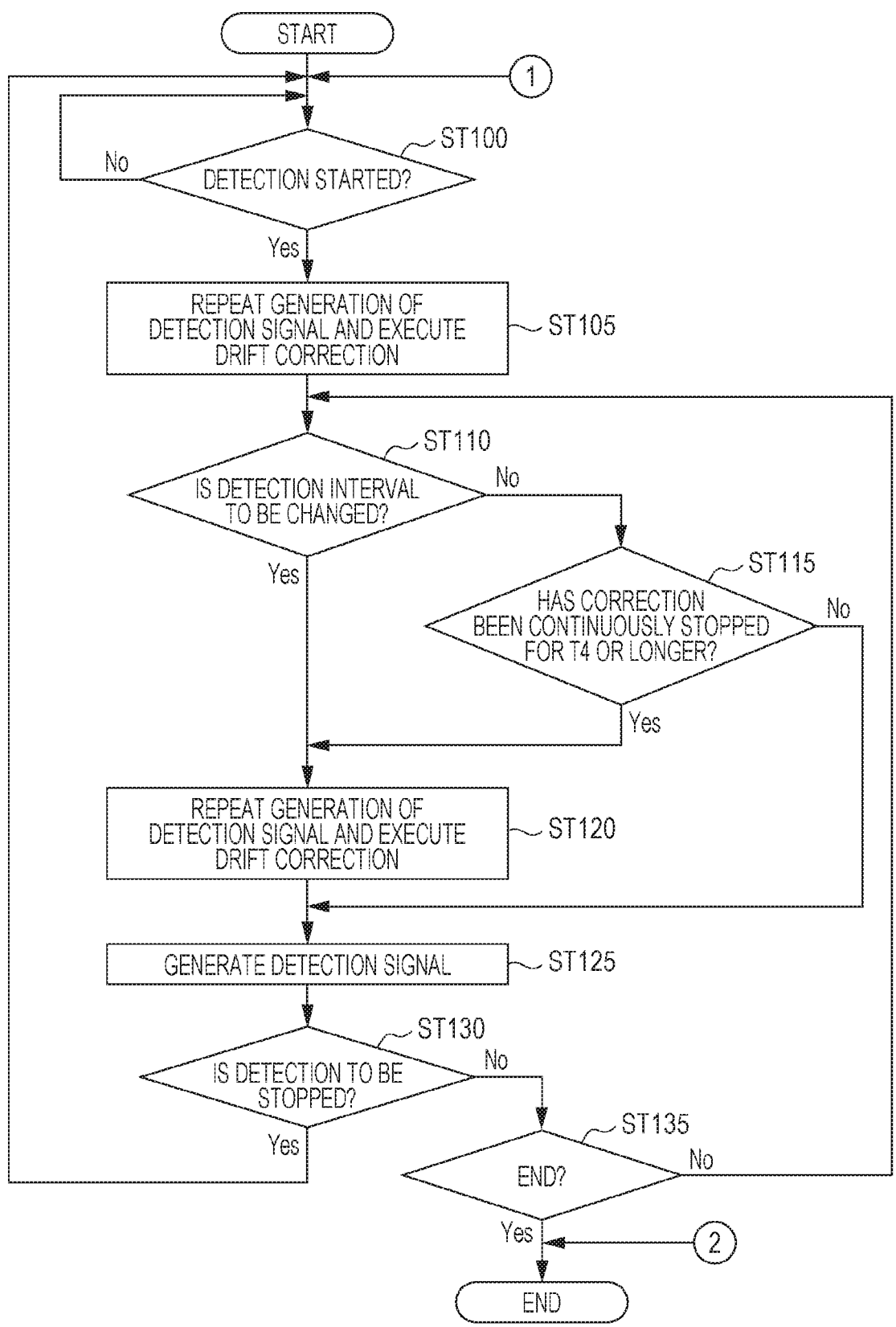
FIG. 9 is a flowchart for illustrating a modification example of the operation for repeatedly generating a detection signal in the input apparatus illustrated in FIG. 1.

FIG. 9 is a flowchart for illustrating a modification example of the operation for repeatedly generating the detection signal in the input apparatus illustrated in FIG. 1 (FIG. 4). The flowchart illustrated in FIG. 9 is a flowchart in which step ST115 is added to the flowchart of FIG. 4, and the other steps are the same as those of the flowchart of FIG. 4. However, in step ST120, the processing illustrated in FIG. 7 or FIG. 8 is executed.

When a command to change the interval for repeatedly generating the detection signal S is input to the interface 50 (ST110: Yes) after the update of the correction value by the drift correction in step ST105 is stopped, and also when correction of the detection signal S is continuously stopped for predetermined time T4 or more (ST115: Yes), the control unit 301 again starts the update of the correction value by the drift correction of step ST120 (FIG. 7 or FIG. 8). This allows intermittent execution of the update of the correction value of the detection signal S even if the repeated generation of the detection signal S is not started (ST100) or if the generation interval of the detection signal S is not changed (ST110). This facilitates correcting a drift in the detection signal S more appropriately.

Second Embodiment

Figure 10:
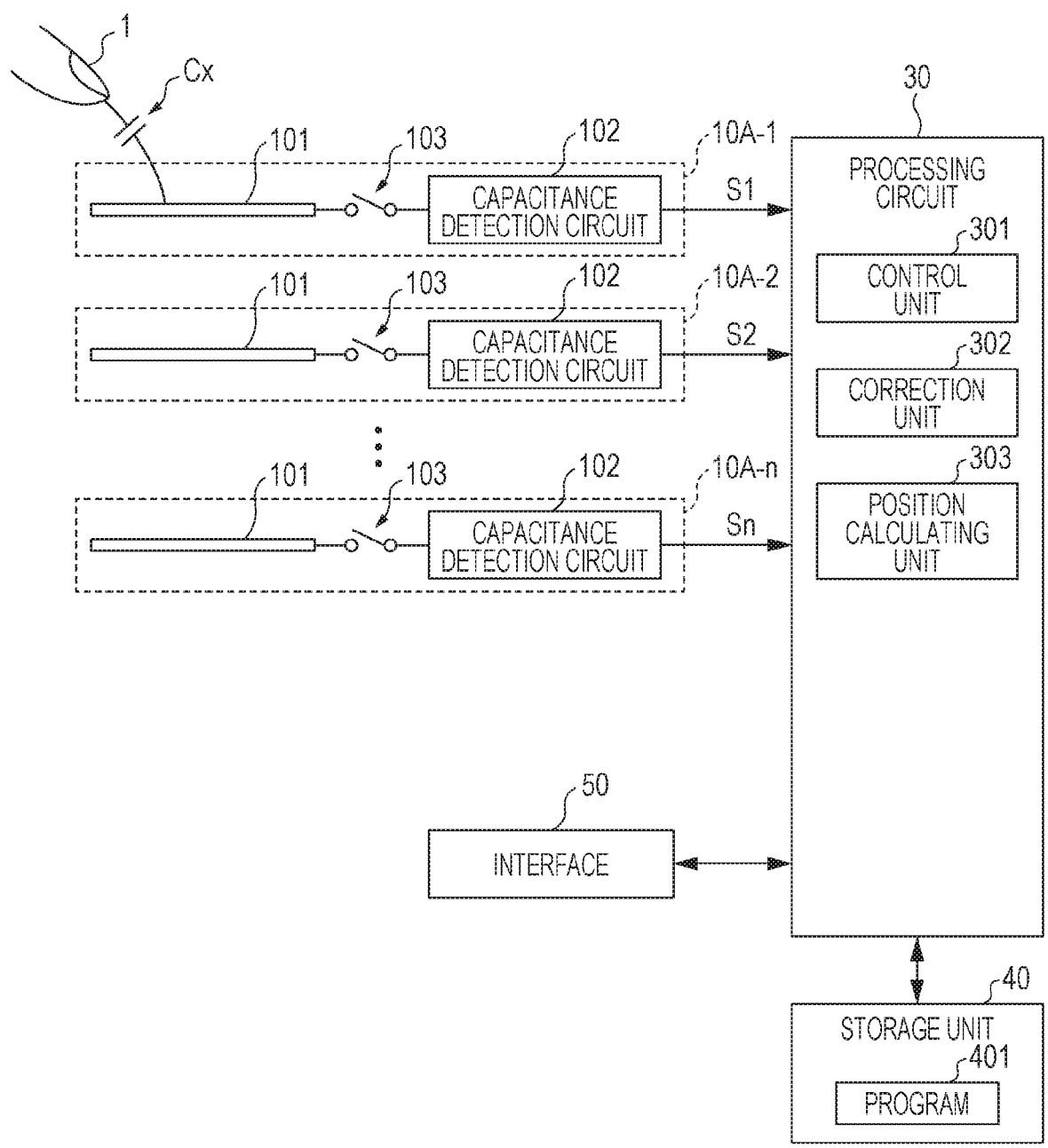
FIG. 10 is a diagram illustrating an example of the configuration of an input apparatus according to a second embodiment.

Next, an input apparatus according to a second embodiment will be described. FIG. 10 is a diagram illustrating an example of the configuration of the input apparatus according to the second embodiment. The input apparatus illustrated in FIG. 10 is such that the detection units 10-1 to 10-n of the input apparatus illustrated in FIG. 1 are replaced with detection units 10A-1 to 10A-n (hereinafter also referred to as "detection unit 10A" without distinction), the drift simulation unit 20 is omitted, and the other configuration is substantially the same as the configuration of the input apparatus illustrated in FIG. 1.

Switch Circuit 103

The detection unit 10A includes a switch circuit 103 in addition to the same configuration as that of the detection unit 10 (the detection electrode 101 and the capacitance detection circuit 102), as illustrated in FIG. 10. The switch circuit 103 is disposed on a path for transmitting the electric charge of the capacitor Cx, between the detection electrode 101 and the capacitance detection circuit 102. When the correction unit 302 corrects the detection signal S, the switch circuit 103 alternately switches between on-state and off-state according to the control of the control unit 301. When the switch circuit 103 is in on-state, the capacitance detection circuit 102 generates a normal detection signal S, and when the switch circuit 103 is in off-state, the capacitance detection circuit 102 operates as a circuit similar to the simulation circuit 201, which has already been described, and generates the drift simulated signal P.

Operation

The operation of the input apparatus according to the second embodiment will be described with reference to the flowcharts of FIGS. 11 to 13.

Figure 11:
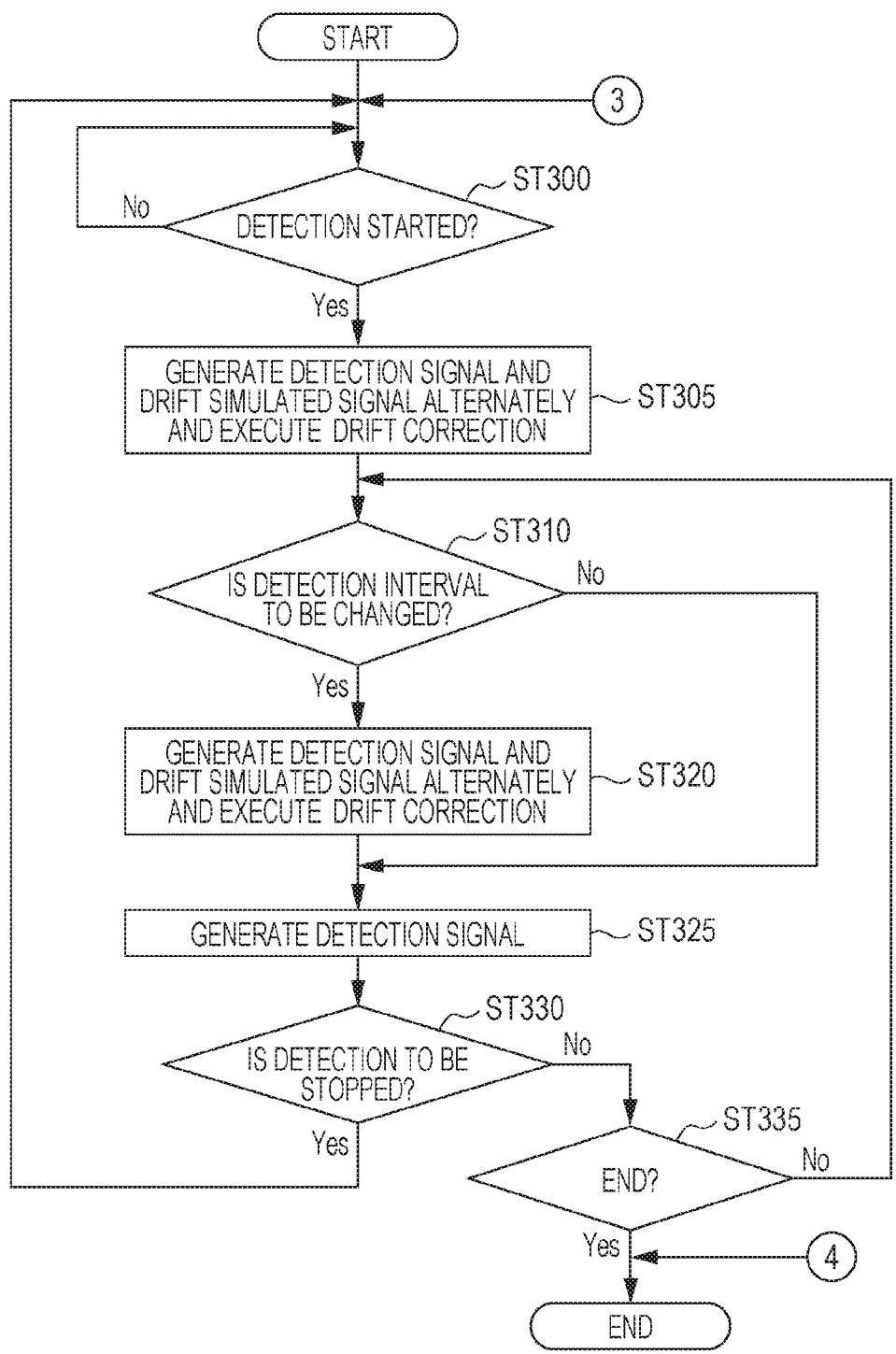
FIG. 11 is a flowchart for illustrating an example of the operation of a correction unit in the input apparatus illustrated in FIG. 10.

FIG. 11 is a flowchart for illustrating an example of processing for repeatedly generating the detection signal S in the input apparatus illustrated in FIG. 10. On startup at power-on or when a command to start a detecting operation is input to the interface 50 (ST300: Yes), the control unit 301 causes the detection signal S and the drift simulated signal P to be alternately generated. In this case, the correction unit 302 corrects a drift in the detection signal S according to a change in the drift simulated signal P (ST305). The details of the operation of step ST305 will be described later.

When the update of the correction value by the drift correction in step ST305 is stopped and thereafter a command to change the interval for repeatedly generating the detection signal S is input to the interface 50 (ST310: Yes), the control unit 301 causes the detection signal S and the drift simulated signal P to be alternately generated. Also in this case, the correction unit 302 performs drift correction of the detection signal S according to a change in the drift simulated signal P (ST320). The details of the operation of step ST320 will be described later.

When a command to temporarily stop the generation of the detection signal S is input to the interface 50 (ST330: Yes), the control unit 301 returns to step ST300 and stops the generation of the detection signal S in the detection unit 10 until a command to start the generation of the detection signal S again is input to the interface 50. If the generation of the detection signal S is not stopped or ended and the power is not shut off (No in ST330 and ST335), the control unit 301 repeats the generation of the detection signal S by the detection unit 10 (ST325) at regular intervals.

Figure 12:
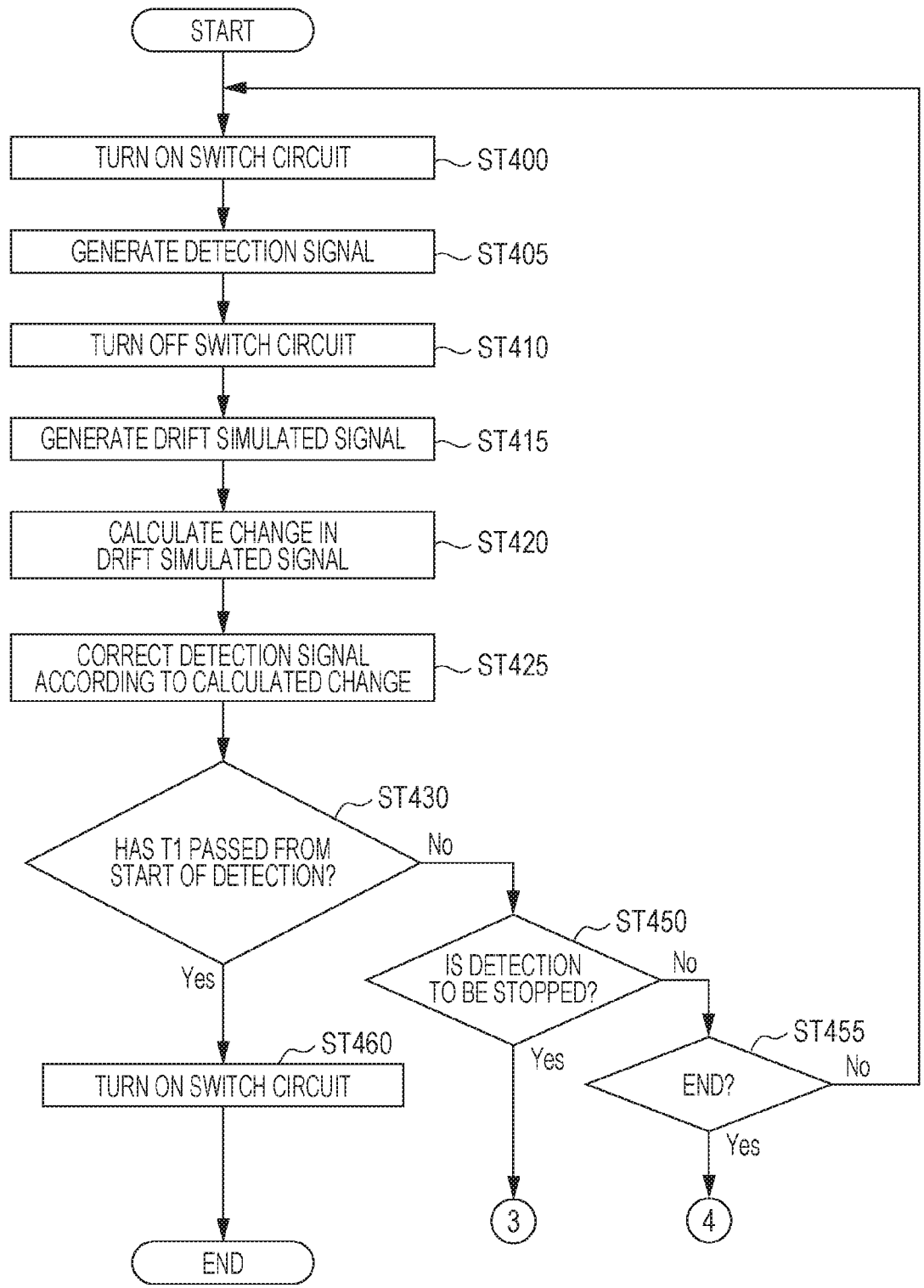
FIG. 12 is a flowchart for illustrating an example of the operation of drift correction after detection is started in the input apparatus illustrated in FIG. 10.

FIG. 12 is a flowchart for illustrating an example of the operation of drift correction after detection is started in the input apparatus illustrated in FIG. 10 (ST305 in FIG. 11). The control unit 301 first sets the switch circuits 103 of the detection units 10A-1 to 10A-n to on-state (ST400) to cause the detection units 10A-1 to 10A-n to generate the detection signal S (ST405). Next, the control unit 301 sets the switch circuits 103 of the detection units 10A-1 to 10A-n to off-state (ST410) and causes the detection units 10A-1 to 10A-n to generate the drift simulated signals P (ST415). When the drift simulated signals P are generated in the detection units 10A-1 to 10A-n, the correction unit 302 calculates the values of change ΔP in the drift simulated signals P of the detection units 10A-1 to 10A-n (ST420). For example, the correction unit 302 stores the drift simulated signals P of the detection units 10A-1 to 10A-n obtained at the start of the processing of step ST305 in the storage unit 40 as initial values. The correction unit 302 calculates the values of change ΔP in the drift simulated signals P by subtracting the initial value from the drift simulated signals P of the detection units 10A-1 to 10A-n which are newly obtained in step ST415.

The correction unit 302 corrects the detection signals S of the detection units 10A-1 to 10A-n obtained in step ST405 according to the values of change ΔP in the detection units 10A-1 to 10A-n calculated in step ST420 (ST425). For example, the correction unit 302 calculates the sum Z of the values of change ΔP in the detection units 10A-1 to 10A-n and calculates a correction value Sc(=α×ΔP) obtained by multiplying the sum Z of the values of change ΔP by a predetermined factor α. The correction unit 302 subtracts the correction value Sc from each of the detection signals S obtained in step ST405 to obtain the corrected detection signals S.

Thereafter, the correction unit 302 determines whether predetermined time T1 has passed from the start of generation of the detection signal S in step ST300 (FIG. 11) (ST430), and if time T1 has not passed, the processing returns to step ST400, and the above processing is repeated. If time T1 has passed after the interval for generating the detection signal S is changed (ST430: Yes), the control unit 301 sets the switch circuits 103 of the detection units 10A-1 to 10A-n to on-state (ST460) and stops the generation of the drift simulated signals P in the detection units 10A-1 to 10A-n (enables the generation of the detection signal S).

When the generation of the drift simulated signals P is stopped, the correction unit 302 stops the generation of the detection signals S according to a change in the drift simulated signals P but holds the correction value Sc calculated last in step ST425 in the storage unit 40. If the detection signals S are generated in step ST325 (FIG. 11), the correction unit 302 subtracts the fixed correction value Sc held in the storage unit 40 from the detection signals S.

When a command to temporarily stop the generation of the detection signals S is input to the interface 50 during the processing of step ST305 (ST450: Yes), the control unit 301 returns to step ST300 described above. If a command to end the generation of the detection signals S is input to the interface 50 (ST455: Yes), the processing unit 30 ends the processing for the generation of the detection signals S.

Figure 13:
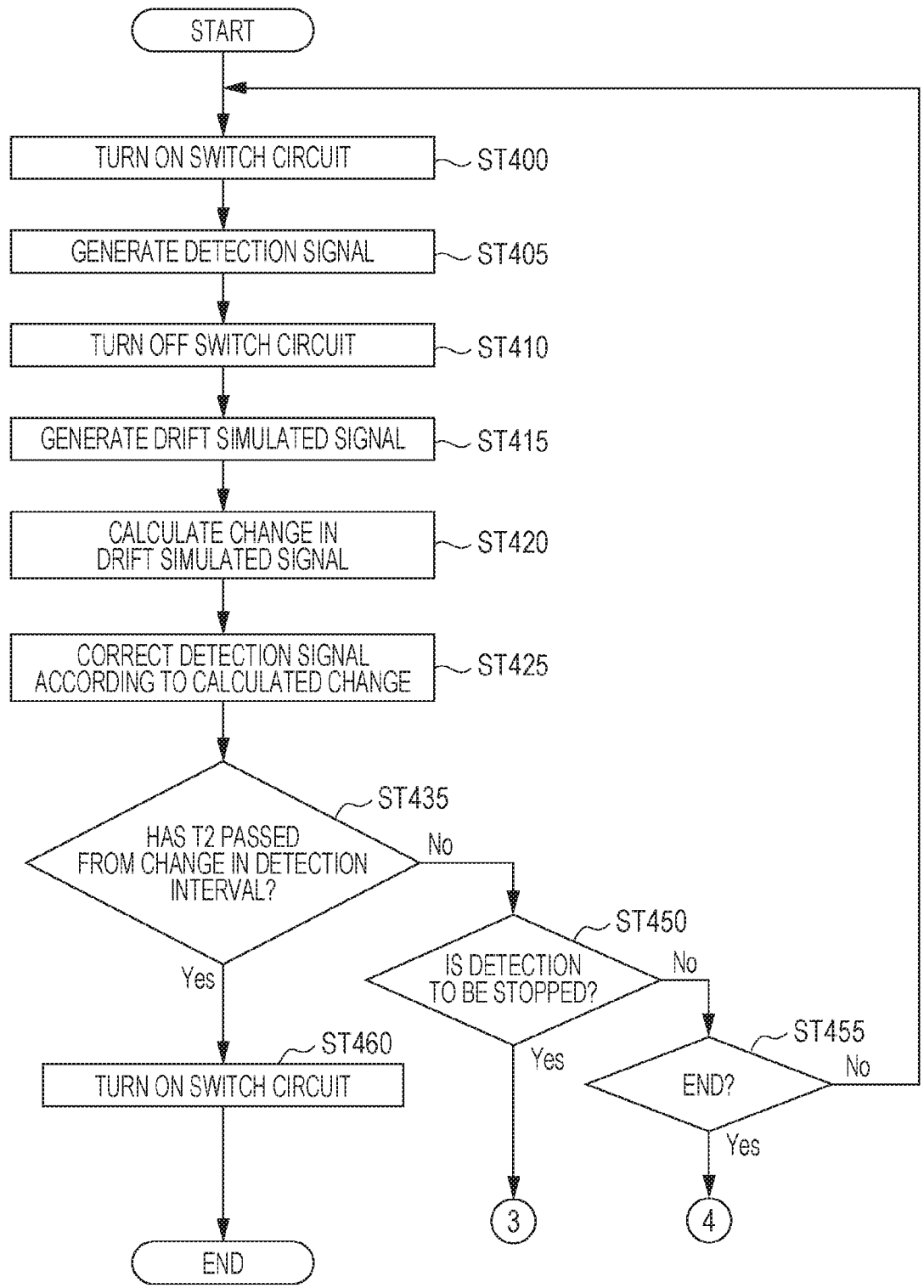
FIG. 13 is a flowchart for illustrating an example of the operation of drift correction after the detection interval has been changed in the input apparatus illustrated in FIG. 10.

FIG. 13 is a flowchart for illustrating an example of the operation of drift correction (ST320 in FIG. 11) after the detection interval has been changed in the input apparatus illustrated in FIG. 10. The flowchart illustrated in FIG. 13 is a flowchart in which step ST430 in the flowchart of FIG. 12 is replaced with step ST435 and the other steps are the same as those of the flowchart illustrated in FIG. 12.

The correction unit 302 determined whether predetermined time T2 has passed after the interval for generating the detection signal S is changed in step ST310 (FIG. 11) (ST435), and if time T2 has not passed, the processing is returned to step ST400, and the processing after step ST400 is repeated. If time T2 has passed after the interval for generating the detection signal S is changed (ST435: Yes), the control unit 301 sets the switch circuits 103 of the detection units 10A-1 to 10A-n to on-state (ST460) and stops the generation of the drift simulated signals P in the detection units 10A-1 to 10A-n (enables the generation of the detection signal S).

As described above, the input apparatus according to the present embodiment includes the switch circuit 103 on a path for transmitting the electric charge of the capacitor Cx, between the detection electrode 101 and the capacitance detection circuit 102. When the switch circuit 103 comes into on-state, the detection signal S is generated in the capacitance detection circuit 102, and when the switch circuit 103 comes into off-state, the drift simulated signal P is generated in the capacitance detection circuit 102. In correcting the detection signal S according to a change in the drift simulated signal P, the on-state and the off-state of the switch circuit 103 are alternately switched, so that the capacitance detection circuit 102 alternately generates the detection signal S and the drift simulated signal P. This allows the capacitance detection circuit 102 to be used both in generating the detection signal S and in generating the drift simulated signal P, simplifying the circuit configuration.

The input apparatus of the present embodiment calculates the value of change ΔP of each of the plurality of drift simulated signals P generated in the capacitance detection circuit 102 of the plurality of detection units 10A and corrects the detection signal S according to the sum Z of the plurality of calculated values of change ΔP. The sum Z obtained by adding up the values of change ΔP of the plurality of drift simulated signals P is larger than the value of change ΔP of a single drift simulated signal P. Therefore, correcting the detection signal S according to the sum Z allows increasing the accuracy of the drift correction.

Modification Examples

Next, modification examples of the input apparatus according to the second embodiment will be described with reference to the flowcharts of FIGS. 14 to 16.

Figure 14:
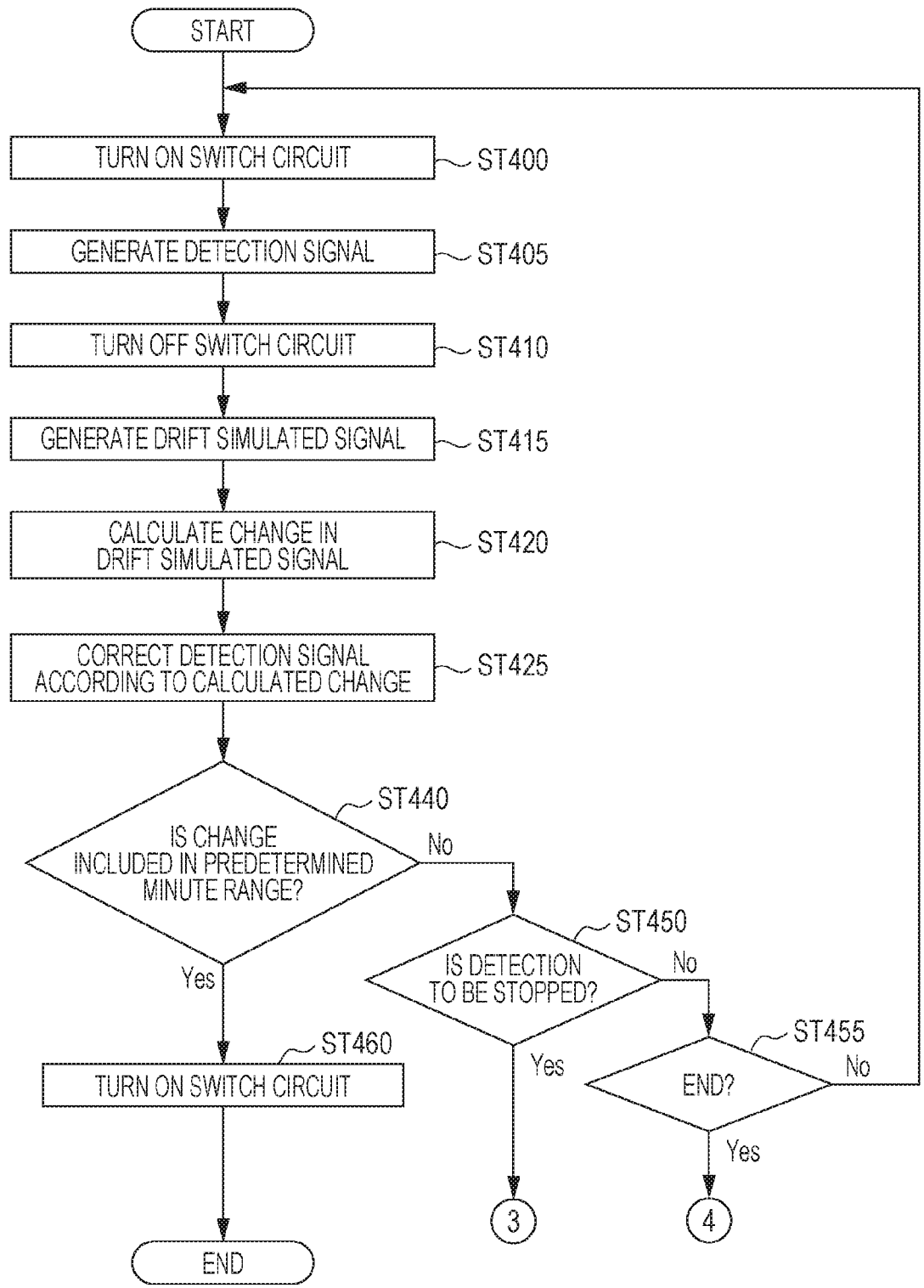
FIG. 14 is a flowchart for illustrating a modification example of the drift correction operation of the input apparatus illustrated in FIG. 10.

FIG. 14 is a flowchart for illustrating a modification example of the drift correction operations (FIGS. 12 and 13) of the input apparatus illustrated in FIG. 10. The flowchart illustrated in FIG. 14 is a flowchart in which step ST430 in the flowchart of FIG. 12 is replaced with step ST440 and the other steps are the same as those of the flowchart illustrated in FIG. 12. In the drift correction operations in the flowcharts of FIGS. 12 and 13, the update of the correction value by the drift correction is stopped when a predetermined time has passed from the detection start time or the detection-interval change time. However, in the drift correction operation of the flowchart of FIG. 14, the update of the correction value by drift correction is stopped when a change in the drift simulated signal P has decreased. In other words, the correction unit 302 determines whether the sum Z of the values of change ΔP calculated in step ST425 is included in a predetermined minute range (ST440), and if the sum Z of the values of change ΔP is not included in the predetermined minute range, the processing is returned to step ST400, and the processing after step ST400 is repeated. If the sum Z of the values of change ΔP is included in the predetermined minute range (step ST440: Yes), the control unit 301 sets the switch circuits 103 of the detection units 10A-1 to 10A-n to on-state and stops the generation of the drift simulated signals P (ST460). Thus, also the method of determining whether the sum Z of the values of change ΔP is included in a predetermined minute range allows appropriate determination of whether a drift in the detection signal S caused by the repeated generation of the detection signal S has concluded.

Figure 15:
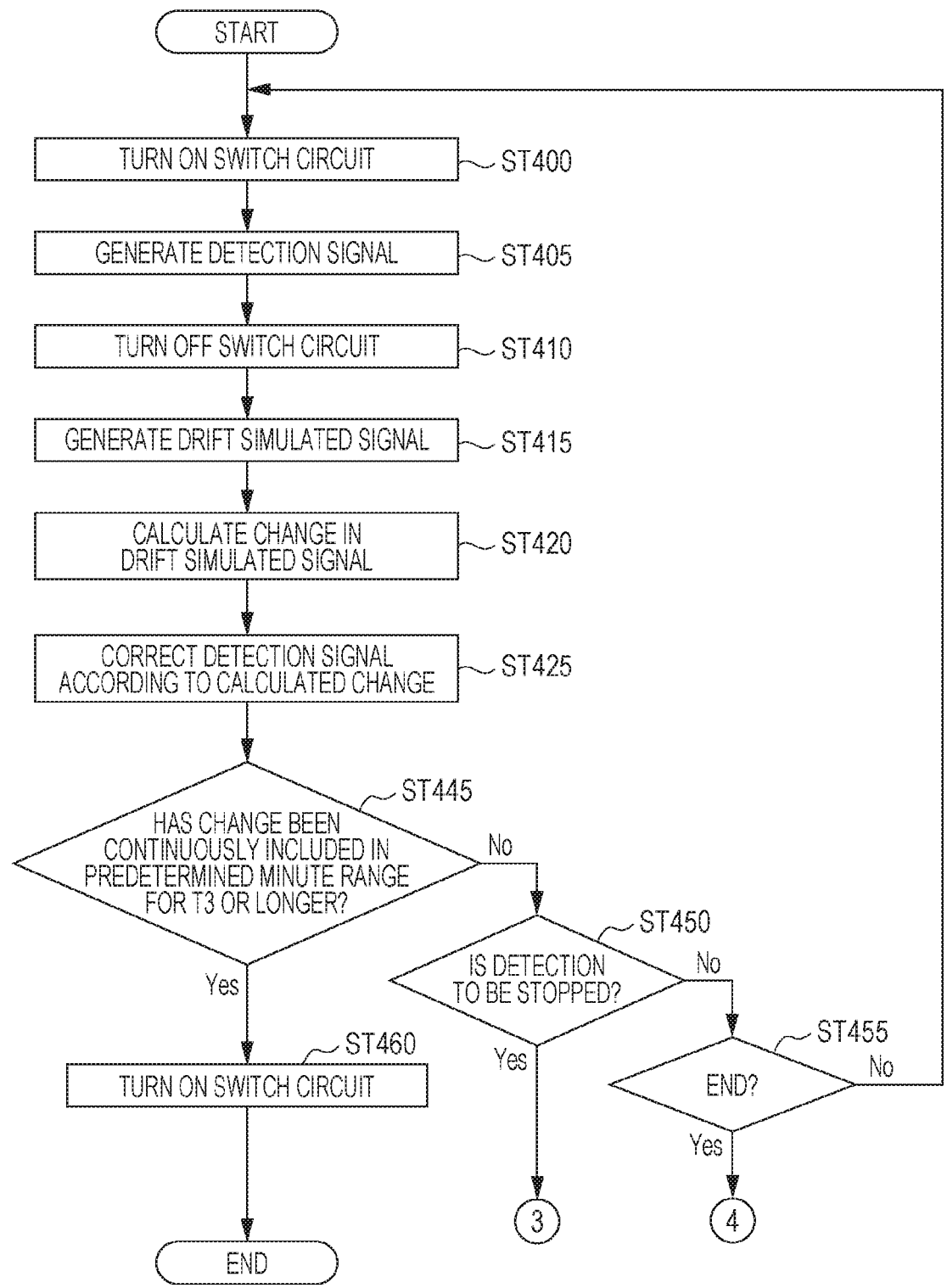
FIG. 15 is a flowchart for illustrating another modification example of the drift correction operation in the input apparatus illustrated in FIG. 10.

FIG. 15 is a flowchart for illustrating another modification example of the drift correction operations (FIGS. 12 and 13) in the input apparatus illustrated in FIG. 10. The flowchart illustrated in FIG. 15 is a flowchart in which step ST430 in the flowchart of FIG. 12 is replaced with step ST445 and the other steps are the same as those of the flowchart illustrated in FIG. 12 In the drift correction operation according to the flowchart of FIG. 15, the update of the correction value by the drift correction is stopped when a state in which a change in the drift simulated signal P has decreased continues for a predetermined time or more. In other words, the correction unit 302 determines whether a state in which the sum Z of the values of change ΔP calculated in step ST425 is included in the predetermined minute range continues for predetermined time T3 or longer (ST445), and if this state has not continued for time T3 or more, the processing returns to step ST400, and the processing after step ST400 is repeated. If the state in which the sum Z of the values of change ΔP is included in the predetermined minute range continues for time T3 or longer (step ST445: Yes), the control unit 301 sets the switch circuits 103 of the detection units 10A-1 to 10A-n to on-state and stops the generation of the drift simulated signal P (ST460). Thus, also the method of determining the duration of the state in which the sum Z of the values of change ΔP is included in the predetermined minute range allows appropriate determination of whether a drift in the detection signal S caused by the repeated generation of the detection signal S has been concluded.

Figure 16:
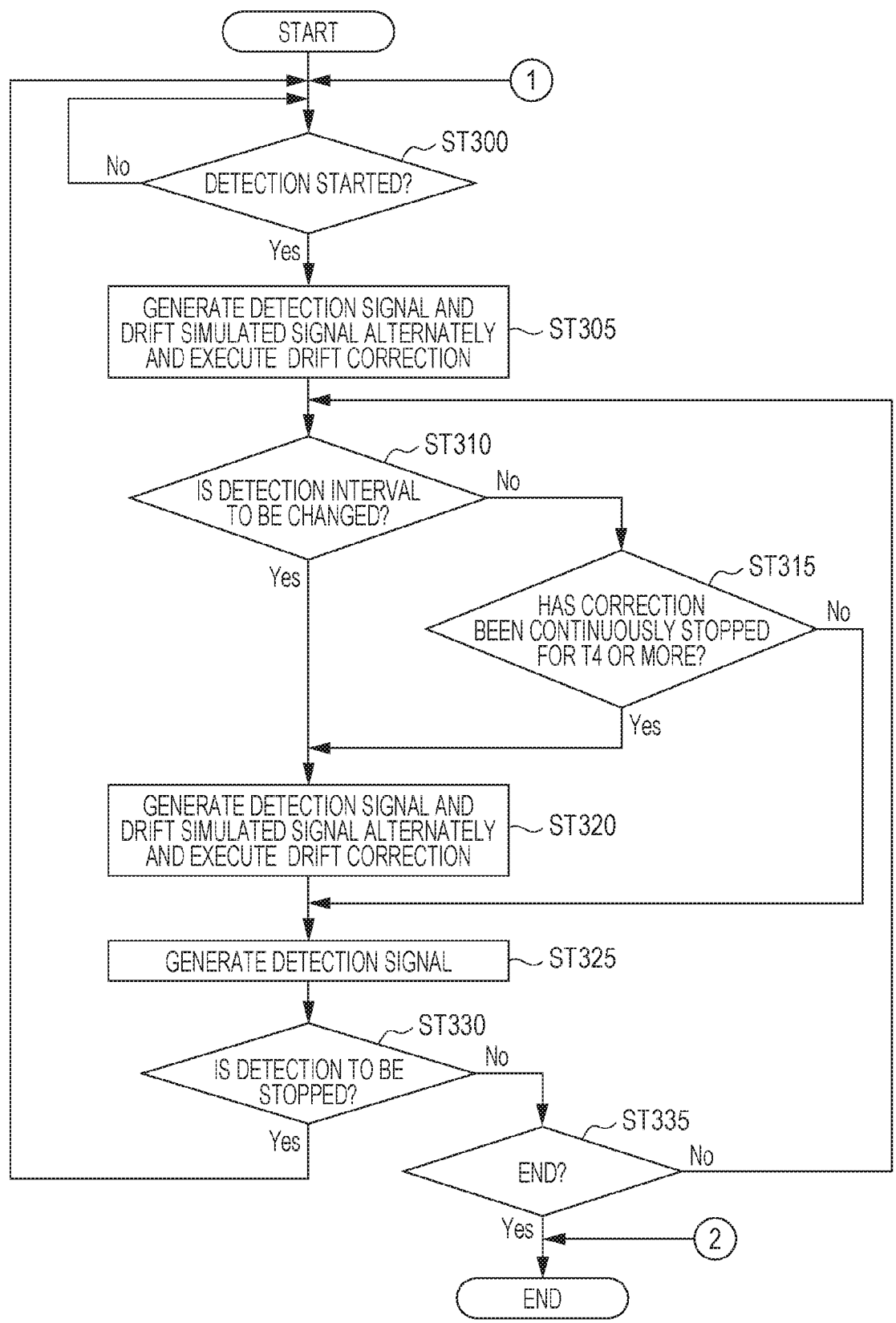
FIG. 16 is a flowchart for illustrating a modification example of an operation for repeatedly generating a detection signal in the input apparatus illustrated in FIG. 10.

FIG. 16 is a flowchart for illustrating a modification example of the operation for repeatedly generating the detection signal in the input apparatus illustrated in FIG. 10 (FIG. 11). The flowchart illustrated in FIG. 16 is a flowchart in which step ST315 is added to the flowchart of FIG. 11, and the other steps are the same as those of the flowchart of FIG. 11. However, in step ST320, the processing illustrated in FIG. 14 or FIG. 15 is executed.

When a command to change the interval for repeatedly generating the detection signal S is input to the interface 50 (ST310: Yes) after the update of the correction value by the drift correction in step ST305 is stopped, and also when update of the correction value of the detection signal S is continuously stopped for predetermined time T4 or more (ST315: Yes), the control unit 301 again starts the update of the correction value by the drift correction of step ST320 (FIG. 14 or FIG. 15). This allows intermittent execution of the update of the correction value of the detection signal S even if the repeated generation of the detection signal S is not started (ST300) or if the generation interval of the detection signal S is not changed (ST310). This facilitates correcting a drift in the detection signal S more appropriately.

The present invention is not limited to the above embodiments and includes variations. For example, the detection units 10 and 10A illustrated in the above examples detect the capacitance (also referred to as "self-capacitance") of the capacitor Cx generated between the detection electrode 101 and the object 1. However, the present invention is not limited to these examples. In another embodiment of the present invention, the detection unit may detect the capacitance of a capacitor formed between an electrode and an electrode (also referred to as "mutual capacitance"). The method for detecting the degree of proximity of an object with the detection unit is not limited to the capacitance sensing method and may be another method (for example, a resistive method and an electromagnetic induction method).

In a first aspect of the present disclosure, an input apparatus includes detection units 10-1 to 10-$n$ that repeatedly generate detection signals S1 to Sn according to the degree of proximity of an object 1, a drift simulation unit 20 that generates a drift simulated signal P that undergoes a change having correlation with a drift in the detection signals S1 to Sn due to the repeated generation of the detection signals S1 to Sn in the detection units 10-1 to 10-$n$, and a correction unit 302 that corrects the detection signal according to the change in the drift simulated signal P at least one of when the repeated generation of the detection signals S1 to Sn in the detection units 10-1 to 10-$n$ is started and when the interval for repeatedly generating the detection signals S1 to Sn in the detection units 10-1 to 10-$n$ is changed.

With the input apparatus according to the first aspect, a drift occurs in the detection signal because of the repeated generation of the detection signal by the detection unit. The drift simulation unit generates a drift simulated signal in which a change correlated to the drift occurs. When repeated generation of the detection signal in the detection unit is started and when the interval for repeatedly generating the detection signal in the detection unit is changed, the drift occurs in the detection signal. In at least one of these cases, the detection signal is corrected according to the change in the drift simulated signal. Thus, the drift in the detection signal due to the repeated generation of the detection signal S can be appropriately corrected.

Preferably, the correction unit may stop update of the correction value of the detection signal according to a change in the drift simulated signal at least one of when a first time has passed after the repeated generation of the detection signal by the detection unit is started and when a second time has passed after the interval for repeatedly generating the detection signal by the detection unit is changed.

Preferably, when the update of the correction value of the detection signal according to a change in the drift simulated signal is stopped, the drift simulation unit may stop the generation of the drift simulated signal.

With this configuration, when the first time has passed after the repeated generation of the detection signal in the detection unit is started and when the second time has passed after the interval for repeatedly generating the detection signal in the detection unit is changed, the update of the correction value of the detection signal according to a change in the drift simulated signal is stopped, and the generation of the drift simulated signal is also stopped. This allows the power consumed to generate the drift simulated signal to be reduced.

Preferably, the correction unit may stop the update of the correction value of the detection signal according to a change in the drift simulated signal when the change in the drift simulated signal is included in a predetermined minute range or when a state in which the change in the drift simulated signal is included in the minute range continues for a third time or longer.

Preferably, the drift simulation unit may stop the generation of the drift simulated signal when the update of the correction value of the detection signal according to a change in the drift simulated signal is stopped in the correction unit.

With this configuration, when the change in the drift simulated signal is included in a predetermined minute range or when a state in which the change in the drift simulated signal is included in the minute range continues for the third time or longer, the update of the correction value of the detection signal according to a change in the drift simulated signal is stopped and the generation of the drift simulated signal is also stopped. This allows the power consumed to generate the drift simulated signal to be reduced.

Preferably, the correction unit may start the update of the correction value of the detection signal according to the change in the drift simulated signal again when the update of the correction value of the detection signal has been stopped continuously for a fourth time or longer.

With this configuration, when the correction of the detection signal has been stopped continuously for the fourth time or longer, the update of the correction value of the detection signal is started again, and when the change in the drift simulated signal is included in a predetermined minute range or when a state in which the change in the drift simulated signal is included in the minute range continues for the third time or longer, the update of the correction value of the detection signal according to a change in the drift simulated signal is stopped again. In other words, the update of the correction value of the detection signal is intermittently executed even if the repeated generation of the detection signal is not started or if the generation interval of the detection signal is not changed. This facilitates correcting a drift in the detection signal more appropriately.

Preferably, the detection unit may include a detection electrode that forms a capacitor whose capacitance changes according to the degree of proximity of the object and a capacitance detection circuit that repeatedly generates a detection signal according to an electric charge of the capacitor transmitted via the detection electrode. The drift simulation unit may include a simulation circuit capable of generating the detection signal, when connected to the detection electrode, according to the electric charge of the capacitor transmitted via the detection electrode. The simulation circuit may repeatedly generate the drift simulated signal in a state in which the simulation circuit is not connected to the detection electrode.

With this configuration, the detection electrode forms a capacitor whose capacitance changes according to the degree of proximity of the object. The capacitance detection circuit repeatedly generates a detection signal according to the electric charge of the capacitor transmitted via the detection electrode. The simulation circuit is capable of generating the detection signal, when connected to the detection electrode, according to the electric charge of the capacitor transmitted via the detection electrode. The drift simulated signal is repeatedly generated in a state in which the simulation circuit is not connected to the detection electrode. For this reason, when the drift simulated signal is repeatedly generated, the change in the drift simulated signal according to the proximity of the object to the detection electrode does not occur, but a change occurs in the drift simulated signal in correlation with a drift in the detection signal caused by the repeated generation of the detection signal.

Preferably, the simulation circuit may repeatedly generate the drift simulated signal at a same interval as the interval for repeatedly generating the detection signal in the capacitance detection circuit.

In this configuration, the interval for generating the detection signal by the capacitance detection circuit and the interval for generating the drift simulated signal by the simulation circuit are the same. This increases the correlation between a drift in the detection signal and a change in the drift simulated signal.

Preferably, the detection unit may include a switch circuit disposed on a path that transmits the electric charge of the capacitor, between the detection electrode and the capacitance detection circuit, the switch circuit switching between on-state and off-state alternately when the detection signal is corrected in the correction unit. The capacitance detection circuit may generate the detection signal when the switch circuit is in on-state and may generate the drift simulated signal as the simulation circuit when the switch circuit is in off-state.

With this configuration, a switch circuit is disposed on a path for transmitting the electric charge of the capacitor, between the detection electrode and the capacitance detection circuit. When the switch circuit comes into on-state, the detection signal is generated in the capacitance detection circuit, and when the switch circuit comes into off-state, the drift simulated signal is generated in the capacitance detection circuit. In correcting the detection signal, the on-state and the off-state of the switch circuit are alternately switched, so that the capacitance detection circuit alternately generates the detection signal and the drift simulated signal. This allows the capacitance detection circuit to be used both in generating the detection signal and in generating the drift simulated signal, simplifying the circuit configuration.

Preferably, the detection unit may include a plurality of detection units. The switch circuits of the plurality of detection units may be in off-state during the same period. The correction unit may calculate each of changes in the plurality of drift simulated signals generate by the capacitance detection circuits of the plurality of detection units every period in which the switch circuits are in off-state and may correct the detection signal according to the sum of the calculated changes in the plurality of drift simulated signals.

With this configuration, each of changes in the plurality of drift simulated signals generated by the capacitance detection circuits of the plurality of detection units is calculated, and the detection signals are calculated according to the sum of the calculated changes in the plurality of drift simulated signals. The sum of changes in the plurality of drift simulated signals is larger than a change in a single drift simulated signal. Therefore, correcting the detection signal according to the sum of the changes allows increasing the accuracy of the correction.

A second aspect of the present disclosure relates to a method for controlling an input apparatus for inputting information according to proximity of an object. In this control method, the input apparatus includes a detection unit that generates a detection signal according to a degree of proximity of the object and a drift simulation unit that generates a drift simulated signal that undergoes a change having correlation with a drift in the detection signal due to repeated generation of the detection signal in the detection unit. The control method includes repeatedly generating the detection signal in the detection unit and correcting the detection signal according to the change in the drift simulated signal at least one of when repeated generation of the detection signal in the detection unit is started and when an interval for repeatedly generating the detection signal in the detection unit is changed.

Preferably, the control method may include stopping update of the correction value of the detection signal according to a change in the drift simulated signal at least one of when a first time has passed after the repeated generation of the detection signal in the detection unit is started and when a second time has passed after the interval for repeatedly generating the detection signal in the detection unit is changed.

Preferably, the control method may include stopping update of a correction value of the detection signal according to a change in the drift simulated signal when the change in the drift simulated signal is included in a predetermined minute range or when a state in which the change in the drift simulated signal is included in the minute range continues for a third time or longer.

Preferably, the control method may include stopping the generation of the drift simulated signal in the drift simulation unit when the update of the correction value of the detection signal according to the change in the drift simulated signal is stopped.

A third aspect of the present disclosure relates to a program for causing a computer to execute the method for controlling an input apparatus according to the second aspect.

Although the present invention has been described with reference to the embodiments, the present invention is not limited to the above embodiments, and various modifications may be made within the scope of the invention.

What is claimed is:

1. An input apparatus for inputting information according to proximity of an object approaching thereto, the apparatus comprising:
at least one detection unit that repeatedly generates a detection signal corresponding to a degree of proximity of the object, the detection signal including a drift therein caused by repeated generation of the detection signal;
a drift simulation unit that generates a drift simulation signal including a change corresponding to the drift in the detection signal; and
a correction unit that corrects the detection signal based on the change in the drift simulation signal (i) when the repeated generation of the detection signal is started, (ii) when an interval for the repeated generation of the detection signal is changed, or both (i) and (ii),
wherein the correction unit corrects the detection signal by updating a correction value corresponding to the change in the drift simulation signal,
and wherein the correction unit stops updating the correction value (a) when a first predetermined time has passed after the repeated generation of the detection signal is started, (b) when a second predetermined time has passed after the interval for the repeated generation of the detection signal is changed, or both (a) and (b).

2. The input apparatus according to claim 1,
wherein the correction unit also stops updating the correction value(c) when the change in the drift simulation signal is within a predetermined range, or (d) when the change in the drift simulation signal remains within the predetermined range for a third predetermined time or longer.

3. The input apparatus according to claim 2, wherein the correction unit resumes updating the correction value of the detection signal when the update of the correction value has been halted for a fourth predetermined time or longer.

4. The input apparatus according to claim 1, wherein the drift simulation unit stops generating the drift simulation signal when the correction unit stops updating the correction value.

5. The input apparatus according to claim 1,
wherein the detection unit includes:
a detection electrode configured to form a capacitor, a capacitance of which changes according to the degree of proximity of the object; and
a capacitance detection circuit configured to repeatedly generate the detection signal according to an electric charge received from the capacitor via the detection electrode,
and wherein the drift simulation unit includes:
a simulation circuit having a structure capable of generating the detection signal, if connected to the detection electrode, according to the electric charge received from the capacitor via the detection electrode, the simulation circuit repeatedly generating the drift simulation signal without being connected to the detection electrode.

6. The input apparatus according to claim 5, wherein the simulation circuit repeatedly generates the drift simulation signal at an interval which is the same as an interval at which the capacitance detection circuit repeatedly generates the detection signal.

7. The input apparatus according to claim 5,
wherein the detection unit further includes:
a switch circuit provided between the detection electrode and the capacitance detection circuit, the switch circuit alternately switching between an on-state for transmitting the electric charge therethrough, and an off-state for not transmitting the electric charge from the detection electrode, when the detection signal is being corrected in the correction unit,
and wherein the capacitance detection circuit generates the detection signal when the switch circuit is in the on-state, and operates as the simulation circuit when the switch circuit is in the off-state, thereby generating the drift simulation signal.

8. The input apparatus according to claim 7, comprising a plurality of detection units,
wherein all of the switch circuits in the plurality of detection units simultaneously turn to the off-state, whereby a plurality of capacitance detection circuits in the plurality of detection units generate a plurality of drift simulation signals during a same time period,
and wherein the correction unit calculates respective changes in the plurality of drift simulation signals every time period in which the switch circuits are in the off-state, and corrects the detection signals based on a sum of the calculated changes in the plurality of the drift simulation signals.

9. The input apparatus according to claim 1, wherein the correction unit corrects the detection signal using a last-updated correction value after stopping updating the correction value.

10. The input apparatus according to claim 1, wherein the drift simulation unit stops generating the drift simulation signal when the correction unit stops updating the correction value.

11. A method for controlling an input apparatus for inputting information according to proximity of an object approaching thereto, the input apparatus including a detection unit and a drift simulation unit, the method comprising:
repeatedly generating, in the detection unit, a detection signal corresponding to a degree of proximity of the object, the detection signal including a drift therein caused by repeated generation of the detection signal;
generating, in the drift simulation unit, a drift simulation signal including a change corresponding to the drift in the detection signal;
correcting the detection signal based on the change in the drift simulation signal (i) in response to starting the repeated generation of the detection signal is started, (ii) in response to changing an interval for the repeated generation of the detection signal is changed, or both (i) and (ii), the correcting the detection signal including:
updating a correction value corresponding to the change in the drift simulation signal; and
stopping updating the correction value (a) in response to a first predetermined time that has passed after the repeated generation of the detection signal is started, (b) in response to a second predetermined time that has passed after the interval for the repeated generation of the detection signal is changed, or both (a) and (b).

12. The method according to claim 11, wherein the method further comprises:
stopping update of the correction value (c) in response to the change in the drift simulation signal that is within a predetermined range, or (d) in response to the change in the drift simulation signal that remains within the predetermined range for a third predetermined time or longer.

13. The method according to claim 12, further comprising:
stopping the generation of the drift simulation signal in response to stopping the update of the correction value of the detection signal.

14. A non-transitory computer-readable medium with an executable program stored therein, for causing a computer to execute the method for controlling an input apparatus according to claim 11.

15. The method according to claim 12, further comprising:
resuming updating the correction value of the detection signal after the update of the correction value has been halted for a fourth predetermined time or longer.

16. The method according to claim 11, further comprising:
correcting the detection signal using a last-updated correction value after stopping updating the correction value.

17. The method according to claim 11, further comprising:
stopping generating the drift simulation signal in response to stopping the updating the correction value.

18. An input apparatus for inputting information according to proximity of an object approaching thereto, the apparatus comprising:
  at least one detection unit that repeatedly generates a detection signal corresponding to a degree of proximity of the object, the detection signal including a drift therein caused by repeated generation of the detection signal, the detection unit including:
    a detection electrode configured to form a capacitor, a capacitance of which changes according to the degree of proximity of the object; and
    a capacitance detection circuit configured to repeatedly generate the detection signal according to an electric charge received from the capacitor via the detection electrode;
  a drift simulation unit that generates a drift simulation signal including a change corresponding to the drift in the detection signal, the drift simulation unit including:
    a simulation circuit having a structure capable of generating the detection signal, if connected to the detection electrode, according to the electric charge received from the capacitor via the detection electrode, the simulation circuit repeatedly generating the drift simulation signal without being connected to the detection electrode; and
  a correction unit that corrects the detection signal based on the change in the drift simulation signal (i) when the repeated generation of the detection signal is started, (ii) when an interval for the repeated generation of the detection signal is changed, or both (i) and (ii),
  wherein the detection unit further includes:
    a switch circuit provided between the detection electrode and the capacitance detection circuit, the switch circuit alternately switching between an on-state for transmitting the electric charge therethrough, and an off-state for not transmitting the electric charge from the detection electrode, when the detection signal is being corrected in the correction unit,
  and wherein the capacitance detection circuit generates the detection signal when the switch circuit is in the on-state, and operates as the simulation circuit when the switch circuit is in the off-state, thereby generating the drift simulation signal.

19. The input apparatus according to claim 18, comprising a plurality of detection units, wherein each detection electrode is provided with a corresponding switch circuit.

* * * * *